United States Patent
Faur et al.

(10) Patent No.: US 6,613,697 B1
(45) Date of Patent: Sep. 2, 2003

(54) LOW METALLIC IMPURITY SIO BASED THIN FILM DIELECTRICS ON SEMICONDUCTOR SUBSTRATES USING A ROOM TEMPERATURE WET CHEMICAL GROWTH PROCESS, METHOD AND APPLICATIONS THEREOF

(75) Inventors: Maria Faur, North Olmsted, OH (US); Horia M. Faur, North Olmsted, OH (US); Mircea Faur, North Olmsted, OH (US)

(73) Assignee: Special Materials Research and Technology, Inc., North Olmsted, OH (US)

( * ) Notice: Subject to any disclaimer, the term of this patent is extended or adjusted under 35 U.S.C. 154(b) by 0 days.

(21) Appl. No.: 09/892,191

(22) Filed: Jun. 26, 2001

(51) Int. Cl.$^7$ .................... H01L 21/31; H01L 21/469
(52) U.S. Cl. .................. 438/770; 438/769; 438/787; 438/790; 427/443.2; 427/435
(58) Field of Search ............... 438/770, 769, 438/787, 789, 790; 427/443.2, 435, 397.7, 169

(56) References Cited

U.S. PATENT DOCUMENTS

| | | | |
|---|---|---|---|
| 2,505,629 A | | 4/1950 | Thomsen et al. |
| 4,332,973 A | | 6/1982 | Sater |
| 4,347,097 A | | 8/1982 | Nishizawa |
| 4,409,422 A | | 10/1983 | Sater |
| 4,431,683 A | | 2/1984 | Sasaki et al. |
| 4,462,846 A | | 7/1984 | Varshney |
| 4,468,420 A | | 8/1984 | Kawahara et al. |
| 4,516,314 A | | 5/1985 | Sater |
| 4,693,916 A | * | 9/1987 | Nagayama et al. ...... 427/397.7 |
| 5,073,408 A | | 12/1991 | Goda et al. |
| 5,132,140 A | * | 7/1992 | Goda et al. .................. 427/169 |
| 5,266,289 A | | 11/1993 | Tsugeno et al. ............. 423/339 |
| 5,314,724 A | * | 5/1994 | Tsukune et al. ............ 427/489 |
| 5,429,995 A | | 7/1995 | Nishiyama et al. |
| 5,492,859 A | | 2/1996 | Sakaguchi et al. |
| 5,506,006 A | | 4/1996 | Chou et al. |
| 5,536,361 A | | 7/1996 | Kondo et al. |
| 5,616,233 A | | 4/1997 | Jenn-Gwo et al. |
| 5,646,440 A | | 7/1997 | Hasegawa |
| 5,648,128 A | | 7/1997 | Yah et al. |
| 5,659,192 A | | 8/1997 | Sarama et al. |
| 5,661,092 A | | 8/1997 | Koberstein et al. |
| 5,674,356 A | | 10/1997 | Nagayama |
| 5,696,003 A | * | 12/1997 | Makita et al. ................. 437/21 |
| 5,703,404 A | | 12/1997 | Matsuura |
| 6,060,026 A | * | 5/2000 | Goldstein .................... 422/186 |
| 6,080,683 A | * | 6/2000 | Faur et al. .................... 438/770 |

FOREIGN PATENT DOCUMENTS

WO    WO 00/57464    9/2000

OTHER PUBLICATIONS

A Selective SiO$_2$ Film–Formation Technology Using Liquid–Phase Deposition for Fully Planarized Multilevel Interconnections, Tetsuya Hamma et al., J. Electrochem. Soc., vol. 140, No. 8, pp. 2410–2414, Aug., 1993, The Electrochemical Society, Inc.

(List continued on next page.)

*Primary Examiner*—Alexander Ghyka
(74) *Attorney, Agent, or Firm*—Pearne & Gordon LLP

(57) ABSTRACT

Disclosed is a method for making low metallic impurity SiO-based dielectric thin films on semiconductor substrates using a room temperature wet chemical growth (RTWCG) process for electronic and photonic (optoelectronic) device applications. The process comprises soaking the semiconductor substrate into the growth solution. The process utilizes a mixture of aqueous inorganic or organic based silicon source solution, an inorganic reduction oxidation (redox) aqueous solution, non-invasive inorganic or organic based liquid additives for adjusting the growth rate and reducing the metallic impurity concentration within the SiO-based film, with or without an electron exchange pyridine based component, and an inorganic homogeneous catalyst for enhancing the growth of the SiO-based film.

29 Claims, 20 Drawing Sheets

OTHER PUBLICATIONS

The Initial Growth Mechanism of Silicon Oxide by Liquid–Phase Deposition, Jenq–Shiuh Chou et al., J. Electrochem. Soc., vol. 141, No. 11, pp. 3214–3218, Nov., 1994, The Electrochemical Society, Inc.

A New Process for Silica Coating, Hirotsugu Nagayama et al., Nippon Sheet Glass Company, Limited, Central Research Laboratory, Itami 664, Japan, pp. 2013–2016.

Semiconductor International, "Researchers Build Optics into Silicon", Jan. 1997.

FEOL cleaning process/RCA procedure, "Cleaning of the Silicone Wafer", at least as early as Jun. 26, 2001, 12 pages.

Semiconductor International, "New Clean Challenges RCA Clean's Domination", Sep. 1995, pp. 18 and 21.

Appl. Phys. Lett. 71 (19), "$SiO_2$ film thickness metrology by x–ray photoelectron spectroscopy", Nov. 10, 1997, pp. 2764–2766.

Surface Interface Analysis, vol. 25, "Elastic Scattering Corrections in AES and XPS. II. Estimating Attenuation Lengths and Conditions Required for their Valid Use in Overlayer/Substrate Experiments",1997, pp. 430–446.

Semiconductor Industry International 1999 SIA Roadmap, The International Technology Roadmap for Semiconductors: 1999, page printout from web site plus,pp. 123–128.

"A New Process for Silica Coating", Hirotsugu Nagayama, Hisao Honda, and Hideo Kawahara, J. Electrochem. Soc.: Solid–State Science and Technology, Aug. 1988, pp. 2013–2016.

"A Selective $SiO_2$ Film–Formation Technology Using Liquid–Phase Deposition for Fully Planarized Multilevel Interconnections", Tetsuya Homma, Takuya Katoh, Yoshiaki Yamada, and Yukinobu Murao, J. Electrochecm. Soc., vol. 140, No. 8, Aug. 1993, pp. 2410–2414.

"The Initial Growth Mechanism of Silicon Oxide by Liquid–Phase Deposition", Jenq–Shiuh Chou and Si–Chen Lee, J. Electrochem. Soc., vol. 141, No. 11, Nov. 1994, pp. 3214–3218.

"The Physicochemical Properties and Growth Mechanism of Oxide ($SiO_{2-x}F_x$) by Liquid Phase Deposition with $H_2O$ Addition Only", Ching–Fa Yeh, Chun–Lin Chen, and Guan–Hong Lin, J. Electrochem. Soc., vol. 141, No. 11, Nov. 1994, pp. 3177–3181.

"Low–Temperature Processed MOSFET's with Liquid Phase Deposited $SiO_{2-x}F_x$ as Gate Insulator", Ching–Fa Yeh, Shyue–Shyh Lin, and Tzy–Yan Hong, IEEE Electron Device Letters, vol. 16, No. 7, Jul. 1995, pp. 316–318.

"Photoassisted Liquid–Phase Deposition of Silicon Dioxide", Chen–Tang Huang, Peng–Heng Chang, and Jin–Shown Shie, J. Electrochem. Soc., vol. 143, No. 6, Jun. 1996, pp. 2044–2048.

* cited by examiner

LOW METALLIC IMPURITY SIO BASED THIN FILM DIELECTRICS ON SEMICONDUCTOR SUBSTRATES USING A ROOM TEMPERATURE WET CHEMICAL GROWTH PROCESS, METHOD AND APPLICATIONS THEREOF

BACKGROUND OF THE INVENTION

This invention relates to a room temperature wet chemical growth (RTWCG) process of SiO-based dielectric coatings on semiconductor substrates and layers including but not restricted to Si, Ge, III-V and I-III-VI, and II-VI compound semiconductors and, specifically, to the RTWCG of SiO-based films on Si in the manufacture of silicon-based electronic and photonic (optoelectronic) device applications. One particular application involves the use of this room temperature wet chemical growth process to make SiO based thin film oxide layers with low metallic and non-metallic impurity concentration for use in the next generations IC microelectronic devices.

Silicon dioxide ($SiO_2$) forms the basis of the planar technology. In industrial practice dielectric coatings for electronic and photonic devices layers are most frequently formed by thermal oxidation of Silicon (Si) in the temperature range 900 to 1200° C. $SiO_2$ is also deposited by chemical vapor deposition (CVD) techniques at lower temperatures (200 to 900° C.) on various substrates.

Thermal and CVD-grown $SiO_2$ based layers are used as diffusion masks, to passivate device junctions, as electric insulation, as dielectric material in Si technology, and as capping layers for implantation-activation annealing in III-V compound semiconductor technology, to name a few.

The growth of dielectric films at low temperatures is very attractive for most device applications due to reduced capital cost, and high output and technological constraints associated with the growth of dielectric thin films using conventional high-temperature growth/deposition techniques.

Dielectric films for microelectronic/photonic (optoelectronic) devices are well known in the art and are usually deposited at near room temperature on various substrates using physical vapor deposition processes including conventional (nonreactive) or reactive resistive, induction or electron beam evaporation, reactive or nonreactive dc or RF magnetron and ion-beam sputtering processes.

Room temperature growth of dielectric layers on semiconductor surfaces using anodic oxidation is known in the art. For silicon, using anodic oxidation up to 200 nm $SiO_2$ layers can be grown on the underlying Si substrates. The anodic oxidation process consumes about 0.43 of the thickness of the oxide from the underlying Si substrate, and is not compatible with most metallization schemes. This limits its application as a replacement of thermal or vacuum deposited $SiO_2$.

Deposition of $SiO_2$ dielectric layers from solutions is known in the art using organo-metallic solutions. In this procedure, the dielectric layer is applied onto the substrate either by dipping the substrate into the solution or by spinning the substrate after a small amount of the solution is applied onto the surface. In both cases the substrate is then placed in an oven to drive off the solvent.

Researchers from Japan, China and Taiwan describe processes for deposition of $SiO_2$ and $SiO_{2-x}F_x$ layers on glass and silicon surfaces using a room temperature (30 to 50° C.) solution growth. The growth of liquid-phase deposited (LPD) $SiO_2$, initially proposed by Thomsen et al. for deposition of $SiO_2$ on the surface of soda lime silicate glass, is based on the chemical reaction of $H_2SiF_6$ with water to form hydrofluoric acid and solid $SiO_2$. The initial $H_2SiF_6$ solution is saturated with $SiO_2$ powder (usually in a sol-gel from). Before immersing the glass into the solution, a reagent that reacts with the hydrofluorosilicilic acid, such as boric acid, was added to the solution. Boric acid reacts with the hydrofluorosilicilic acid and makes the solution supersaturated with silica.

One of the major disadvantages of $SiO_2$ LPD method described above is a very low deposition rate of about 8 nm/hour to about 24 nm/hour, which makes it impractical for growing dielectric layers for most semiconductor device applications. Deposition rates of up to 110 nm/hour are claimed by Ching-Fa Yeh et al. in the hydrofluorosilicilic acid-water system and the composition of the resulting films was reported to be $SiO_{2-x}F_x$ where x is about 2%. Our own experimentation using the LPD method, seems to indicate that the LPD $SiO_2$ has poor adhesion to the Si surfaces, and the maximum growth rate we obtained is smaller than the reported values (less than 25 nm/hour). Even assuming that the reported 110 nm/hour deposition rates are possible, these deposition rates are still too low since assuming that the deposition rate is constant with the deposition time, it will require about 9 hours to deposit an oxide with a thickness of about 1 $\mu$m needed for ULSI interlevel dielectric.

The U.S. Pat. No. 6,080,683, entitled "Room Temperature Wet Chemical Growth Process of SiO Based Oxides on Silicon" issued Jun. 27, 2000 and the U.S. applications Ser. No. 09/602,489 entitled "Room Temperature Wet Chemical Growth Process of SiO Based Oxides on Silicon" and U.S. applications Ser. No. 09/891,832 entitled "Method of Making Thin Films Dielectrics Using a Process for Room Temperature Wet Chemical Growth of SiO Based Oxides on a Substrate" which were filed on Jun. 23, 2000 and Jun. 26, 2001, respectively as a continuation-in-part of the above patent, describe a room temperature wet chemical growth (RTWCG) process and method for growth of a silicon oxide layer on a semiconductor substrate to produce a silicon oxide layer comprising:

a) providing a substrate;

b) providing a reaction mixture comprising a silicon source, a pyridine compound, and an aqueous reduction oxidation solution;

c) a catalyst to enhance the reaction, and d) reacting the mixture with the substrate to form said silicon oxide layer;

High growth rates of SiOX oxides according to related art described above are grown on planar or porous silicon using, commercial grade organic and inorganic silicon sources, a pyridine compound, such as N-n butylpyridinium chloride ($C_9H_{14}ClN$), redox aqueous solutions based on $Fe^{2+}/Fe^3$, an organic or inorganic homogeneous catalyst, and non-invasive additives to adjust the pH of the growth solution. By using the above growth solutions formulations, the SiO based oxide layers grown on various semiconductor substrates have a lower growth rate and a higher metallic and non-metallic impurity concentration, and inferior electric and dielectric properties compared with the SiO-based oxide layers grown using the solution growth formulations described in this patent application.

The term RTWCG process of SiO-based dielectric layers as used herein means a room temperature (e.g. 10–40° C.) wet chemical growth process for silicon oxide layers. While this layer is referred to in this application as a "silicon oxide layer", this means a layer which is $Si_xO_yX_z$ (SiOX) layers where x is from 0.9 to 1.1, y is from 0.9 to 1.1 and z is from 0.01 to 0.2, where Si stands for silicon, O stands for oxygen, and X is either fluorine, (F), carbon (C), nitrogen (N) or a combination of these with iron (Fe), palladium (Ti) or other trace amount of metallic and non-metallic contaminants, depending on the redox system, catalyst, and the non-invasive additives being used.

One useful definition of a "catalyst" is a compound that promotes the reaction wherein the metallic ion of the reduction oxidation solution is subject to a change in its electron state such as from $Fe^{2+}$ to $Fe^{3+}$. Also, a homogeneous catalyst is a catalyst which is dissolved in the reaction solution.

SUMMARY OF THE INVENTION

This invention relates to a room temperature wet chemical growth (RTWCG) process of silicon oxide (SiO) based thin film dielectrics with low metallic and non-metallic impurity concentration on semiconductor substrates and, specifically, to the RTWCG of SiO-based films in the manufacture of silicon-based electronic and photonic (optoelectronic) device applications.

It is an object of the invention to provide a silicon oxide-based thin film dielectrics with low metallic and non-metallic impurity concentration on a semiconductor substrates using a room temperature wet chemical growth (RTWCG) process for electronic and photonic (optoelectronic) device applications that uses solutions growth solutions comprising of organic and inorganic components, that are compatible with device fabrication steps, have large growth rates, low stress, good adhesion to silicon surfaces, is stable on long term air exposure, and high temperature annealing, and that has good conformity.

It is a further object to provide a silicon oxide-based RTWCG process of low dielectric constant SiO based films for use as intermetallic dielectric (IMD) in ultra large scale integrated (ULSI) silicon based microelectronics.

It is a further object to provide an ultra thin film silicon oxide-based RTWCG process to be used as gate dielectric for ULSI silicon based microelectronics.

It is a further object to provide a silicon oxide-based RTWCG process of thin film dielectrics to be used as passivation layers for photonic (optoelectronic) device applications.

It is a further object to provide a silicon oxide-based RTWCG process to grow passivating/antireflection coatings, after the front grid metallization for the fabrication of low cost silicon solar cells and for other photonic (optoelectronic) device applications.

It is a further object to provide a silicon oxide-based RTWCG process to be used as passivating films for porous silicon coated photonic (optoelectronic) devices.

High growth rates of SiOX oxides according to this invention are grown on planar or porous silicon using commercial grade inorganic or organic compounds including but not limited to $H_2SiF_6$ (34%) or other silicon containing salts such as ammonium hexafluorosilicate $(NH_4)_2SiF_6$ as silicon source, with or without the electron exchange pyridine based component. The growth system according to this invention is also comprising of a solution containing metallic ions $Me^{+n}/Me^{+(n+m)}$ where n=0 to 4, and m=1 to 4, a list of which includes but is not restricted to transitional metallic ions such as Ti, Co, V, Cr, Fe, Ni, Cu, Y, Sr, Ce, Ba, Zr, Nb, Ru, Rh, and Pd that enhances the growth and lowers the concentration of the metallic impurities within the SiO-based thin film. The role of the various classes of the above metallic ions are to provide a reduction oxidation (redox) aqueous component such as $Fe^{2+}/Fe^3$, e.g. $K_3Fe(CN)_6$, a catalyst such as $H_2TiF_6$ aqueous component that added to the growth solution is used to enhance the growth of the SiO based thin film, and non-invasive additives that include but are not restricted to NaF, KOH, NaF and $NH_4F$ and HF, HCl, $H_2SO_4$, and $H_2O_2$ that are used according to this invention to adjust the pH of the growth solution, and vary the growth rate, and/or reduce the concentration of metallic and non-metallic impurities within the RTWCG SiO based film.

In a preferred embodiment of the invention, we are substituting all organic components of the growth solution with inorganic components, by using only inorganic components for the silicon source, eliminate the pyridine based components, and use various inorganic combinations for use as redox and catalysts components added to the growth solution from among the non-invasive additives aqueous components based on $Me^{+n}/Me^{+(n+m)}$ where n=0 to 4, and m=1 to 4. The new SiO based oxide layers grown on various semiconductor substrates have a higher growth rate and a lower metallic and non-metallic impurity concentration, and better dielectric properties compared with the SiO-based oxide layers grown using growth solutions that contain organic components.

The RTWCG rate on Si surfaces is from 1 nm/minute to over 100 nn/minute, depending on the composition of the growth solution. The chemical composition of the grown layer has the general formula: $Si_xO_yX_z$, where the significance of Si, O, X, and x, y and z are as explained above.

BRIEF DESCRIPTION OF THE DRAWINGS

The foregoing and other objects, features and advantages of the invention will be apparent from the following more particular description of preferred embodiments of the invention, as illustrated in the accompanying drawings.

FIG. 18b is similar to FIG. 18a; and

DETAILED DESCRIPTION OF THE INVENTION

Figure 1:
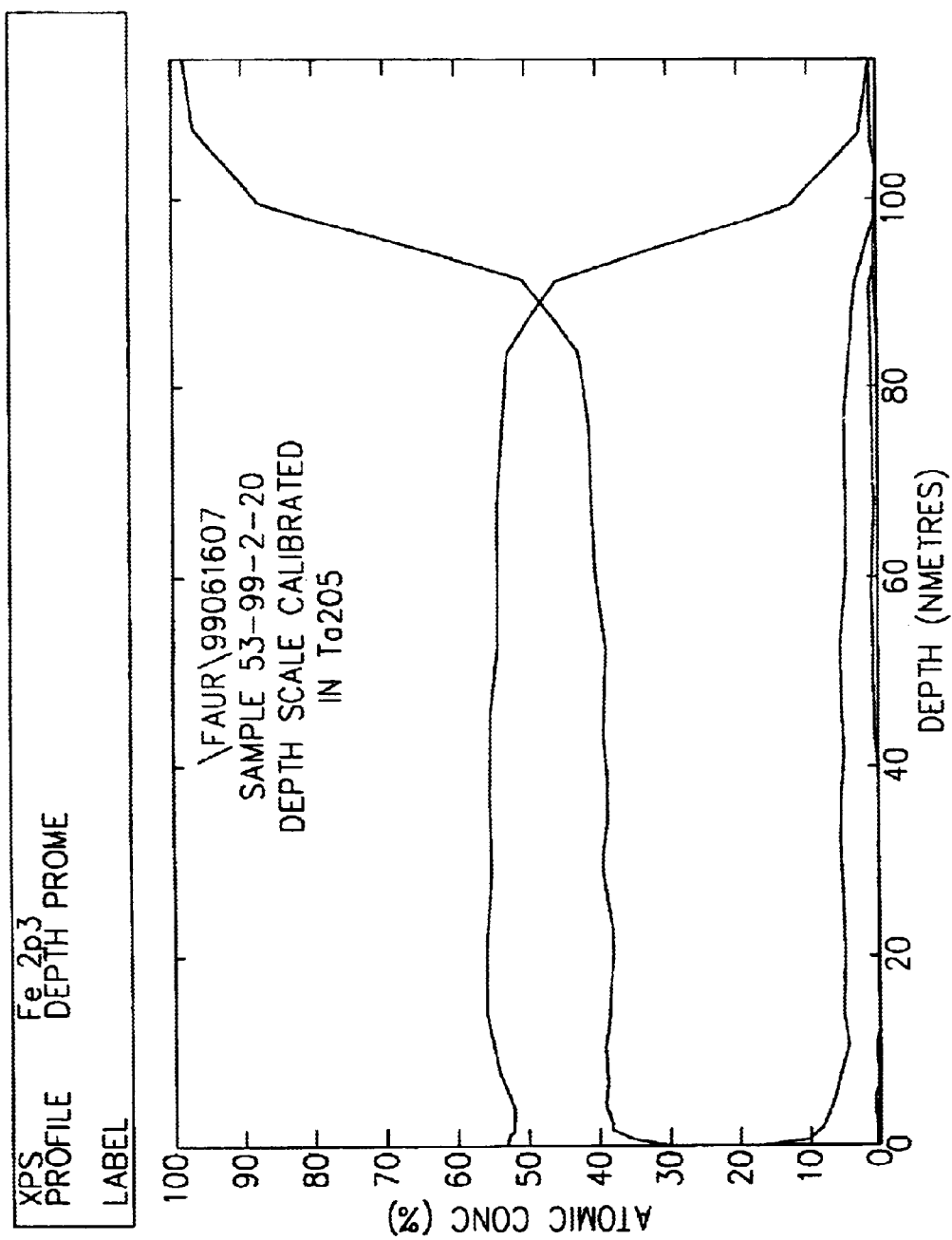
FIG. 1 is a XPS depth profile of a RTWCG SiOX thin film grown on (100) p-Si substrate using a growth solution made of: 3 volume parts of 34% HSiF saturated with silica, 2 volume parts of 60% HTiF solution, 1 volume part of 5% n-BPCl, and 2 volume parts of 5% KFeCN aqueous solution. The growth time of the SiOX film was 20 minutes.

Surface OH groups are known in the art as one of the most important sites for chemical reactions at oxide surfaces. The OH groups are formed by the chemisorption of water molecules on the oxide surface. The hydration mechanism involves the dissociation of an adsorbed water molecule, where an $H^+$ ion bonds to an oxygen ion on the surface and an $OH^-$ ion bonds to a silicon ion on the surface. The SiOH groups can undergo acid or base reactions. They accept a hydrogen ion to become an $SiOH_2^+$ site having a positive charge, or they release a hydrogen ion to become $SiO^-$ site having a negative charge. The reactions are written as:

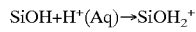

$SiOH + H^+(Aq) \rightarrow SiOH_2^+$

$SiOH \rightarrow SiO^- + H^+(Aq)$

The concentration of the $SiOH_2^+$ and $SiO^-$ species depend on the pH of the aqueous phase. The $SiOH_2^+$ species increases at pH<7, while the $SiO^-$ species increases at pH>7.

After the RCA clean and prior to the final water rinse, the silicon surface is passivated by $\equiv Si-H$ and $\equiv Si-F$ bonds. We define the "induction time" as the time interval $\delta t = t_{ox} - t_{in}$, where $t_{ox}$ is the time referenced to the initial time ($t_{in}$) after which the oxide deposition is initiated. For HF treated surfaces we found an induction time from 10 seconds to 2 minutes. On contrary, on similar silicon samples covered either with a thin native oxide (no RCA clean) or thermally grown $SiO_2$ layers, the induction time is from about 10 to 20 seconds.

Prior to the initiation of the RTWCG of SiOX-based layer, for hydrogen- or fluorine-terminated Si surfaces the Si—H and Si—F bonds has to be converted into the Si—OH bonding group.

The hydration mechanism of hydrogen passivated surfaces should follow the reaction:

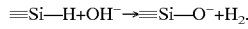

$\equiv Si-H + OH^- \rightarrow \equiv Si-O^- + H_2.$

For $\equiv Si-F$ terminated bonds, rinsing the samples in water allows the Si—F—Si—OH to take place according to the reaction:

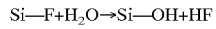

$Si-F + H_2O \rightarrow Si-OH + HF$

From the last two reactions, it is apparent that in the presence of HF, the surface may be subject to HF attack through HF insertion into the Si—O bond, according to the reaction:

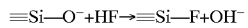

$\equiv Si-O^- + HF \rightarrow \equiv Si-F + OH^-$ with the subsequent removal of the surface Si atom from the surface of the underlying Si—O oxide.

We found that after the HF dip, rinsing the substrates in deionized water for 5 to 10 minutes or into 0.1% $H_2O_2$ for 1 to 2 minutes, depending on the crystallographic orientation, doping type and majority carrier concentration, the induction time for all silicon substrates was below 20 seconds.

Once the growth of a native oxide layer has began, Si—H and Si—F bonds are replaced by the Si—OH bonds. These Si—OH groups in turn facilitate the incorporation from the growth solution of silicon and oxygen by forming Si—O—Si bond angles. Associated Si—OH groups also act as preferential adsorption sites for water molecules further speeding up oxygen and silicon incorporation process.

The growth mechanism of SiOX thin films using the RTWCG process is not yet completely understood. A single example from among the questions yet to be answered is the incorporation of iron, nitrogen, carbon and other impurities into the $SiO_2$ film. For example, a puzzling question is why nitrogen atoms are incorporated at all into the RTWCG $SiO_2$, film. According to thermodynamic equilibrium, and the growth mechanism we have proposed (see above), nitrogen should not incorporate into the $SiO_2$ film that is grown on Si.

At least two reasons for the presence of nitrogen in the $SiO_2$ film can be suggested. First, nitrogen atoms may simply be kinetically trapped at the reaction zone near the Si/liquid growth interface (i.e., the nitrogen is present in a non-equilibrium state, where the rate of the transition to equilibrium is slow and some N is trapped) or by structural defects in the $Sio_2$ film.

The basic idea in this model is that nitrogen brought into the film during the growth reacts only with the Si—Si bonds at or near the interface, not with Si—O bonds in the bulk of the $SiO_2$ overlayer. Alternatively, the nitrogen at the interface may indeed be thermodynamically stable due to the presence of free-energy terms that are not yet understood.

As known, nitrogen lowers the interfacial strain known to exist at the $SiO_2$/Si interface. Therefore, its presence at the interface is beneficial especially in the case of ultra-thin Si—O—N films for advanced CMOS gate applications. On the other hand, for this and other applications (e.g. high-k dielectrics), incorporation of various metallic impurities into the RTWCG film is desirable, if in a completely oxidized form. However, for other applications in microelectronics, even parts per billion (ppb) level of metallic impurities (especially Fe) is not desirable.

In designing the room temperature RTWCG process of SiO-based thin film dielectric layers, we sought the following conditions:

the use of elements, which are known to harm the semiconductor devices, should be avoided; only elements that are not detrimental and do not impugn the oxide or substrate are acceptable, for example, the so-called non-invasion elements include Si (O, C, H, and N);

for growing SiOX oxides, metal impurities such as Mg, Ti, and Ta, which are known to introduce large density of states at the Si/dielectric interface, should be avoided;

the coatings should be stable in reducing and oxidizing atmosphere, with respect to factors such as heat, humidity, prolonged exposure to UV light, atomic oxygen and ionizing radiation such as high energy electrons and protons;

the coatings should have contamination-free bonding to the Si surfaces and sufficient mechanical strength;

the growth process should be applicable to any Si surface, irrespective of crystal orientation, size and shape, and the growth process should be compatible with processing sequences of various Si devices, e.g. VLSI microelectronics with critical features below 0.1 microns.

Si Wafer Cleaning Prior to the RTWCG SiOX Step

Introduction

Surface preparation of silicon (SI) semiconductor wafers prior to the RTWCG of SiOX thin films will be referred to as wafer cleaning. Surface cleaning techniques used by the semiconductor industry are usually divided into four groups: front-end of line (FEOL), diffusion-end of line (DEOL), metallization-end of line (MEOL) and back-end of line (BEOL).

There are two basic types of wafer cleaning in use today: RCA-type wet cleans, predominantly used in FEOL and DEOL processes, and solvent-based cleans used in MEOL and BEOL processes. Of interest for surface cleaning of Si surfaces prior to RTWCG of SiOX films are the FEOL processes.

FEOL Cleaning

Although several new technologies (such as vapor phase cleaning, UV-assisted cleaning, cryogenic aerosol cleaning and, of course, plasma cleaning) show promise, the semiconductor industry still relies on wet processes for most FEOL cleaning steps, i.e. up to 40 cleaning steps during FEOL integrated circuit manufacturing.

The best known and most widely used FEOL cleaning process is the RCA cleaning sequence. W. Kern developed the basic RCA procedure in 1965 while working for RCA (Radio Corporation of America)—hence the name. The RCA cleaning of the silicon surface employs two steps called Standard Clean 1 (SC1) and Standard Clean 2 (SC2). In the SC1 step, wafers are exposed to a hot mixture of water-diluted hydrogen peroxide and ammonium hydroxide that removes organic surface films and particles. The traditional SC1 step has $H_2O_2:NH_4OH:H_2O$ (1:1:5)volume parts components in the solution. In the SC2 step, the silicon wafer is exposed to a hot mixture of hot water-diluted hydrogen peroxide and hydrochloric acid, which is designed to remove ionic and heavy metal atomic contaminants using a $H_2O_2:HCL:H_2O$ (1:1:6)volume parts solution. Removal of a thin silicon dioxide layer where metallic contaminants may accumulated as a result of SC1, is done using a diluted $HF:H_2O$ (1:50) volume parts solution.

The best known and most widely used FEOL cleaning process was developed at RCA in 1965. The so-called RCA clean process employs two steps called Standard Clean 1 (SC1) and Standard Clean 2 (SC2). In the SC1 step, wafers are exposed to a hot mixture of water-diluted hydrogen peroxide and ammonium hydroxide that removes organic surface films and particles. In the SC2 step, the wafer is exposed to a hot mixture of hot water-diluted hydrogen peroxide and hydrochloric acid, which is design to remove metals. Over time, many modifications to the traditional RCA FEOL clean have been proposed and implemented, including the use of "Piranha" (98% $H_2SO_4$ and 30% $H_2O_2$) and HF steps before, after and between the SC1 and SC2 steps.

One reason for the modified RCA wet clean's continued success is the availability of ultra high purity water (UHPW) and chemicals. Beyond increased chemical purity, the most significant trend with regard to the RCA clean is the use of more dilute mixtures in an effort to reduce surface roughening. SEMATECH's J80 program, a joint program between IBM, National Semiconductor, Motorola and CFM Technologies, for example, showed it is possible to achieve substantial improvement in cleaning performance while utilizing much more diluted chemistries than conventionally used. Today very few leading edge companies still run the traditional 5:1:1 $NH_4OH/H_2O_2/H_2O$ or $HCl/H_2O_2/H_2O$ for SC1 and SC2, respectively. Many of them are at least 10 times more dilute.

In a similar vein, IC manufactures and independent research organizations, such as IMEC in Belgium and Tohuku University in Japan, have been working to see if they can even completely eliminate one or more wet cleaning steps for some applications. IMEC, for example, has shown that the standard SC2 solution can be replaced with dilute 0.1 mole/liter HCl without $H_2O_2$, cutting chemical consumption and cost while maintaining metal removal efficiency.

In order to improve the uniformity of the RTWCG SiOX films we tried various surface cleaning known techniques. For example, in order to reduce the chemicals and water consumption while improving the uniformity of the SiOX film we tried an improvement to the RCA clean that was unveiled by Mallirickrodt Baker and Motorola (Semiconductor International September 1995, p.18). This new cleaning process, dubbed the "Baker Clean," employ's the use of TMAH (tetramethyl ammonium hydroxide) that is said to be simpler, more efficient and more stable than the RCA clean. However the uniformity of the RTWCG SiOX film was not as good as when dilute RCA clean was used.

Improved Si Wafer Cleaning

The FEOL Si wafer cleaning sequence which gave the best results is a modification of the traditional RCA cleans, by including the generally known in the art use of "Piranha" and HF steps before, after and between the SC1 and SC2 cleaning steps sequence. Withing the present work we introduced MoRCA and MoPiranha: Modified RCA and Modified Piranha that gave the best results in improving the RTWCG SiOX thin film uniformity and drastically reducing the defect (e.g. pinholes) density within the films. Also, the concentration of HF, $H_2SO_4$ and HCl solutions we used is lower as compared to the traditional RCA clean. This has the added environment, safety and health (ESH) and cost benefits of reduced chemical use and waste disposal. The diagram below show the Si wafer cleaning sequence incorporating these additional steps and concentration modifications.

The MoRCA cleaning sequence that gave the best RTWCG SiOX thin film uniformity and defect density, was found to be the following:

MoPiranha {[98% H2SO4:30% $H2O2:H_2O$] (2:1:20)}, 3 to 5 minutes at 50 to 60 C.
UHPW rinsing
0.5% HF, 1 minute
UHPW rinsing
MoRCA, SC-1 {[NH4OH:H2O2:H2O] (3:1:25)}, 3 to 5 minutes at 50 to 60 C.
2×UHPW rinsing
0.5% HF, 30 seconds
UHPW rinsing
MoRCA, SC-2, {[0.05 mole/liter $HCl:H_2O_2$] (25:1)}, 3 to 5 minutes at 50 to 60 C.
UHPW rinsing
0.5% HF, 30 seconds
UHPW rinsing
N2 Drying As used above:
MoRCA refers to Modified RCA and MoPiranha refers to Modified Piranha.
UHPW refers to Ultra High Purity Water.
All chemicals should be reagent grade or better purity, except for the SC-2 chemicals, which should be semiconductor grade.

High growth rate SiOX thin films were grown using the RTWCG process on silicon and other semiconductor substrates using commercial grade $H_2SiF_6$ (34%) as silicon source, redox $Fe^{2+}/Fe^{3+}$ (10%), with or without the n-n butyldipyriniumchloride (n-BPCl) electron transfer component, a homogeneous catalyst such as dihydrogen hexafluorotitanate ($H_2TiF_6$) 60% aqueous solution (HTiF) which is use to increase the SiOX RTWCG rate, and various non-invasive additives that are used to adjust the pH of the growth solution, and the growth rate and lower the concentration of metallic impurities within the RTWCG SiO-based thin film. In a preferred embodiment of the invention, the growth solution is made by mixing 1 to 5 volume parts of 34% $H_2SiF_6$ (HSiF) with 2 to 5 volume parts of 0.5 M KFeCN aqueous solution, 1 to 3 parts of 60% of HTiF aqueous solution, and 0 to 4 volume parts of 5% n-BPCl aqueous solution. This solution, for convenience we are going to call: "the basic solution (BS)." The BS can be saturated with $SiO_2$-containing sources including but not restricted to silica, and silica gel. Unless otherwise specified, the % given represents a percentage by weight in an aqueous solution (if applicable).

In order to increase the purity of the RTWCG SiOX thin films, grown on various semiconductor substrates, including but not restricted to silicon substrates, while increasing the growth rate, we tried a wide variety of aqueous organic and inorganic silicon precursors, with or without the electron exchange pyridinium component, inorganic redox systems, and non-invasive inorganic additives and catalysts.

A short list of Si liquid precursors we tried with good and satisfactory results include organic and inorganic aqueous silicon sources such as: fluorosilicates and chlorosilicattes, and brormosilicates, and more specifically, hydrofluorosilic acid, silicon tetrachloride, silicon tetrafluoride, silicon tetrabromide, dichlorosilane, and silica gel. Specific inorganic silicon sources include $K_2SiF_6$, $Mg_2Si3O_8$, $MoSi_2$, $Na_2SiO_3$, $SiS_2$, $ZrSi_2$, $Mg_2Si$, $H_2SiF_6$, $(NH_4)_2SiF_6$, $SiO_2$, SiO, and Si. Organic silicon sources can also be used and include for example, $(CH_3)_3SiOK$, $(CH_3)_4NOH:10SiO_2$, $(CH_3)_2CSi(CH_3)_2Cl$, $[(CH_3)SiO]_4$, $CaSiO_3$, $CaSiO_2$, and $[(CH_3)Si]$.

We tried various metallic $Me^{+n}/Me^{+(n+m)}$ ions where n=0 to 4, and m=1 to 4, a list of which includes but is not restricted to transitional metallic ions such as Ti, Co, V, Cr, Fe, Ni, Cu, Y, Sr, Ce, Ba, Zr, Nb, Ru, Rh, and Pd that enhances the growth and lowers the concentration of the metallic impurities within the SiO-based thin film. The role of the various classes of the above metallic ions are to provide a reduction oxidation (redox) aqueous component such as $Fe^{2+}/Fe^3$, e.g. $K_3Fe(CN)_6$, a catalyst such as $H_2TiF_6$ aqueous component that added to the growth solution is used to enhance the growth of the SiO based thin film, and non-invasive additives that include but are not restricted to NaF, KOH, $NH_4OH$, and $NH_4F$ and HF, HCl, $H_2SO_4$, and $H_2O_2$ that are used according to this invention to adjust the pH of the growth solution, and vary the growth rate, and/or reduce the concentration of metallic and non-metallic impurities within the RTWCG SiO based film. Catalysts such as palladium II trifluoroacetate $Pd(O_2C_2F_3)_2$ (from here on written as PdFAc), and $Ti^{4+}$-based aqueous solutions such as hexafluorotitanate $H_2TiF_6$ (from here on written as HTiF), titanium chloride $TiCl_4$ (from here on written as TiCl) and $(NH_4)_2TiF_6$ (from here on written as NHTiF) were found to be acceptable catalysts for the growth of SiOX layers.

For best results, the solution is agitated by any practical means until the solids are completely dissolved, and during the RTWCG so as to ensure uniform coating.

Chemical composition of the SiOX thin films was derived from the X-ray Photoelectron Spectroscopy (XPS) and Auger Electron Spectroscopy (AES) data. The depth corresponding in all the XPS and AES depth profiles of SiOX thin films is calculated in reference to a $Ta_2O_5$ oxide. Ellipsometric data on selected samples and Dektak profiles of etched features show that the real thickness of the SiOX film are over 2 times higher than those corresponding in the abscise of the XPS profiles. Dektak determinations of chemically etched SiOX thin films, performed for several hundred samples indicate that the thickness of the SiOX films are about 2.2 times higher than the corresponding XPS depths shown in the XPS depth profiles, referenced to $Ta_2O_5$. In order to avoid any confusions, all depths and the growth rates, respectively, in the following discussion will be referenced to $Ta_2O_5$. Therefore the real thickness and growth rate in each case can be calculated by multiplying the XPS depth and XPS generated growth rate by 2.2.

In FIG. 1 is an XPS depth profile of a RTWCG SiOX thin film grown on (100) p-Si substrate using a growth solution made of: 3 volume parts of 34% HSiF saturated with silica, 2 volume parts of 60% HTiF solution, 1 volume part of 5% n-BPCl, and 2 volume parts of 5% KFeCN aqueous solution. The growth time of the SiOX film was 20 minutes. Prior to the growth, the surface of the Si substrate was cleaned using the improved MoRCA wafer cleaning sequence described above, rinsed in deionized (DI) water and blown dry in nitrogen. No post growth surface treatment was used prior to the XPS surface analysis.

In Table 1 are shown quantitative XPS data, including the position, peak areas and the atomic concentration of the main components of the SiOX film oxide in FIG. 1, recorded after sputtering about 29 nm from the surface.

TABLE 1

Quantification Table for Experiment SiOX thin film in FIG. 1, after sputtering 29 nm from the surface.

| Peak | Binding Energy (eV) | SF | Pk. Area | Tx. Function | [AT] % |
| --- | --- | --- | --- | --- | --- |
| Fe 2p3 | 706.40 | 2.00 | 136.593 | 0.3 | 0.056 |
| F 1s | 687.4 | 1.00 | 425.020 | 0.3 | 0.343 |
| O 1s | 532.20 | 0.66 | 50126.168 | 0.3 | 54.314 |
| Ti 2p | 460.60 | 1.80 | 161.714 | 0.3 | 0.061 |
| N 1s | 398.00 | 0.42 | 422.887 | 0.3 | 0.490 |
| C 1s | 284.00 | 0.25 | 2552.198 | 0.2 | 6.297 |
| Si 2p | 102.80 | 0.27 | 18329.264 | 0.2 | 38.438 |

Figure 2:
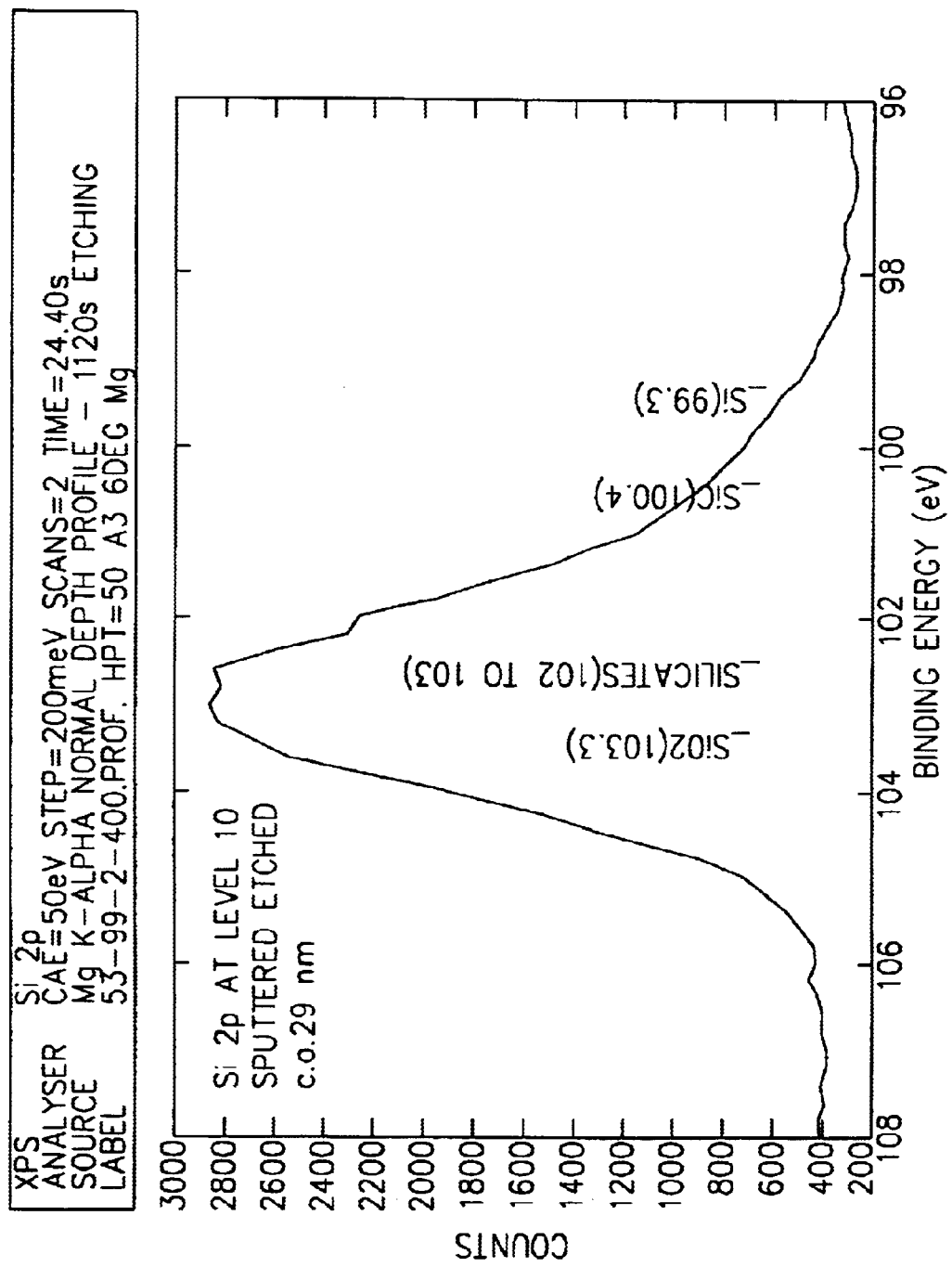
FIG. 2 is the XPS Si 2p peak after sputtering 0.29 nm from the surface of the SiOX thin film in FIG. 1.

The chemical composition of the SiOX films as a function of depth was derived for each representative sample from an analysis of the Si 2p, O 1s, and C 1s peaks binding energies (BE's). For example, the Si 2p peak after sputtering 0.29 nm from the surface of the SiOX thin film above is shown in FIG. 2. As seen in this case the SiOX film is made up of a mixture of $SiO_2$ (BE=103.3 eV), $Si_3N_4$, and various silicates (BE's=102 to 103 eV) with lower concentrations of SiC (BE=100.4 eV), and metallic Si (BE=99.3 eV).

Figure 3:
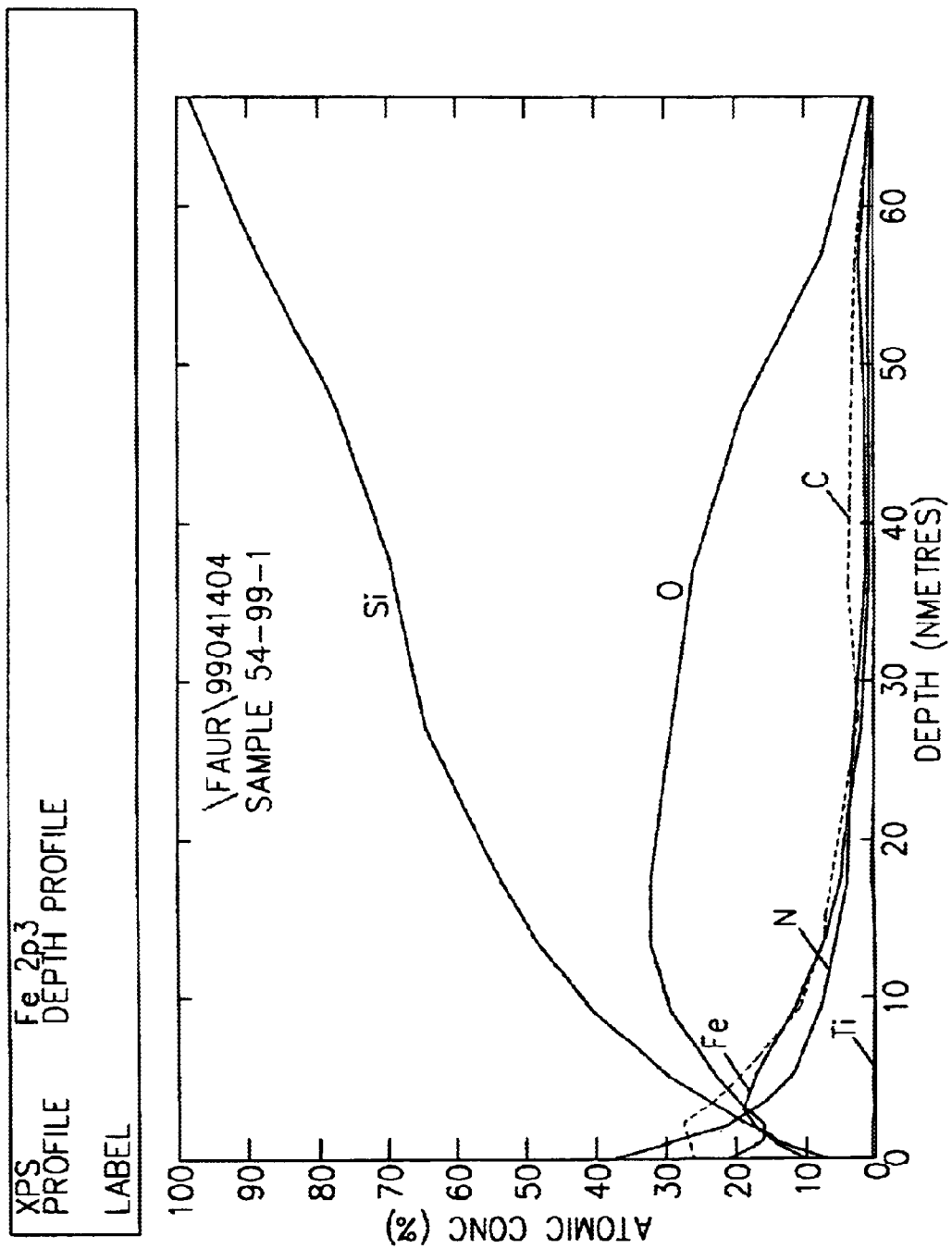
FIG. 3 is a XPS depth profile of a SiOX thin film grown for 4 minutes on a p-type Si substrate, using a chemical solution made of: 3 volume parts of 34% HSiF, 2 volume parts of 60% HTiF solution, 2 volume part of 5% KFeCN aqueous solution, and 1 volume part DI water.

For various practical applications such as in microelectronics, the concentration of the metallic impurities present on the RTWCG SiOX thin film have to be further reduced. By using the electron donor N-n butylpyridinium chloride component into the growth solution even in small amounts the concentration of the metallic contaminants is considerably reduced (see Table 1). In FIG. 3 is an earlier XPS depth profile of a SiOX thin film grown on a p-type Si substrate, using a chemical solution that does not contain the n-BPCl component. In this case the RTWCG growth solution is made of: 3 volume parts of 34% HSiF, 2 volume parts of 60% HTiF solution, 2 volume part of 5% KFeCN aqueous solution, and 1 volume part DI water. The growth time of this SiOX film was 4 minutes. As seen the growth solutions in FIG. 1 and FIG. 3 are identical, except that the 1 volume part of 5% n-BPCl was replaced with 1 volume part of DI water. As a result of this compositional change of the chemical growth solution, the iron (Fe) concentration at the surface of the SiOX film in FIG. 3 is about 20%, that is an increase of over 200 times the surface Fe concentration of the SiOX film in FIG. 1. However, the growth rate of the SiOX film in FIG. 3 is significantly higher (about 16 nm/min.) compared to that of the SiOX film in FIG. 1 (about 5.5 nm/min). The growth rate further increases when using a more concentrated growth solution. For example, when the growth solution was made of 3 volume parts of 34% HSiF, 2 volume parts of 60% HTiF solution, 2 volume part of 5% KFeCN aqueous solution the SiOX film thickness for an identical growth time (4 minutes) and conditions, was about 190 nm, that is more than twice the SiOX film thickness in FIG. 1. Consequently, when the growth solution was made of 3 volume parts of 34% HSiF, 2 volume parts of 60% HTiF solution, 2 volume part of 5% KFeCN aqueous solution, and 2 volume parts of DI water, the thickness of the SiOX film after 4 minutes growth time was only about 32 nm, that is about 3 times smaller that that of the SiOX film in FIG. 3. The Fe surface concentration of the SiOX film above, using 2 volume parts of DI water, decreased to about 7.5% as compared to the SiOX oxide in FIG. 3. Further diluting the growth solution decreases significantly the growth rate, while further decreasing the surface Fe concentration.

While high growth rates are desired for applications requiring thick film dielectrics, formulations of the growth solutions that ensure a low growth rate of the SiO based thin film are necessary for a controlled growth of ultra thin SiO based fims with low metallic impurity content. Low growth rate SiOX films are possible either by using DI water diluted solutions, as shown above, or by using various non-invasive aqueous additives to the growth solution. The SiOX thin film in FIG. 4 was grown in two minutes on a p-type Si substrate. The growth solution, in this case, was made of 5 volume parts of 34% HSIF, 2 volume parts of 60% HTiF solution, 1 volume part of 5% KFeCN aqueous solution, 3 volume parts of 5% nBPCl aqueous solution, and 3 volume parts of 0.5 M KOH and 1 volume part, respectively of 0.1 M of NaF aqueous solutions. The apparent low O/Si ratio in FIG. 4, which was generated at 10 degree emission angle, is due to the transparency of the thin SiOX film. As seen in FIG. 5, when a 60 degree emission angle was used the O/Si ratio increased significantly. Using XPS data such as in FIG. 5 generated at 10° and 60° degrees emission angle respectively, and known formalisms [e.g. Appl. Phys. Lett. 71 (19), 1997, and Surf. Int. Analysis, 25, 430 (1997)], the thickness of the above oxide, reported to $Ta_2O_5$, is about 2.2 nm. Although the true oxide thickness using Dektak profiles etched in the SiOX film was not possible due to the step limitation of our profiler, assuming the same ratio of about 2.2 we found for thicker SiOX films between the Dektak and the XPS generated thickness (reported to $Ta_2O_5$), then the true thickness and growth rate of the above SiOX film is about 4.8 nm and 2.4 nm/minute, respectively. This low growth rate allows one to control the growth of ultra-thin SiO based films used as gate oxide in advanced IC CMOS devices. The surface concentration of Fe, K, and Na were below the detectability limit of the high performance XPS system, and only trace level if any of F and oxidized Ti were detected. Low SiO based films with low growth rates and low metallic and non-metallic impurity concentrations were also grown using the growth solution in FIG. 4, but without the nBPCl component.

Figure 6:
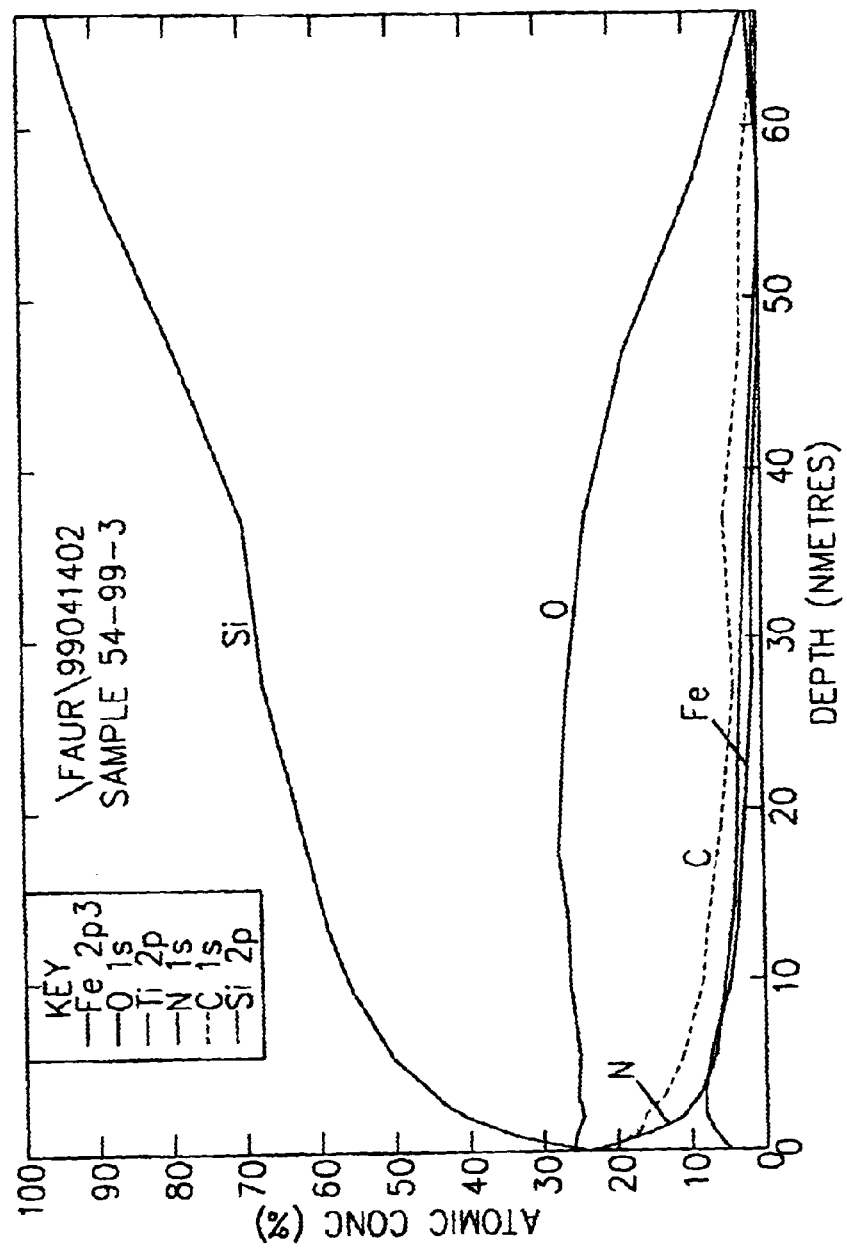
FIG. 6 is a XPS depth profile of a SiOX thin film grown on Si for 7 minutes using a growth solution similar to the one in FIG. 3 that was kept for 3 months in the dark, at room temperature in an enclosed plastic container.

When using growth solutions any of the pyridinium components, the shelf life was usually less than one week. We have run several experiments to verify the self life of the growth solutions that do not contain the pyridinium components. FIG. 6 is a XPS depth profile of a SiOX thin film grown on Si for 7 minutes using a growth solution similar to the one in FIG. 3 that was kept for 3 months in the dark, at room temperature in an enclosed plastic container. As seen, using the aged solution it takes 7 minutes growth time rather than 6 minutes when using the fresh solution to grow a SiOX film of similar thickness. The surface Fe concentration, however, when using aged solution is less than half that of a film grown in fresh solution. Using a six months old solution, the SiOX film has essentially similar growth rate and composition as when using the 3 months old solution.

This indicates that a self life for the growth solution of at least 6 months is possible, which compares well or is better than the shelf life of known spin-on organic-based $SiO_2$ thin films. When using growth solutions that contained any of the pyridinium components, the shelf life was significantly lower, usually less than one week, which is not practical for most potential users. This is yet another motivation for the new formulations of the growth solutions, which according to the present invention do not contain the pyridinium components.

Figure 7:
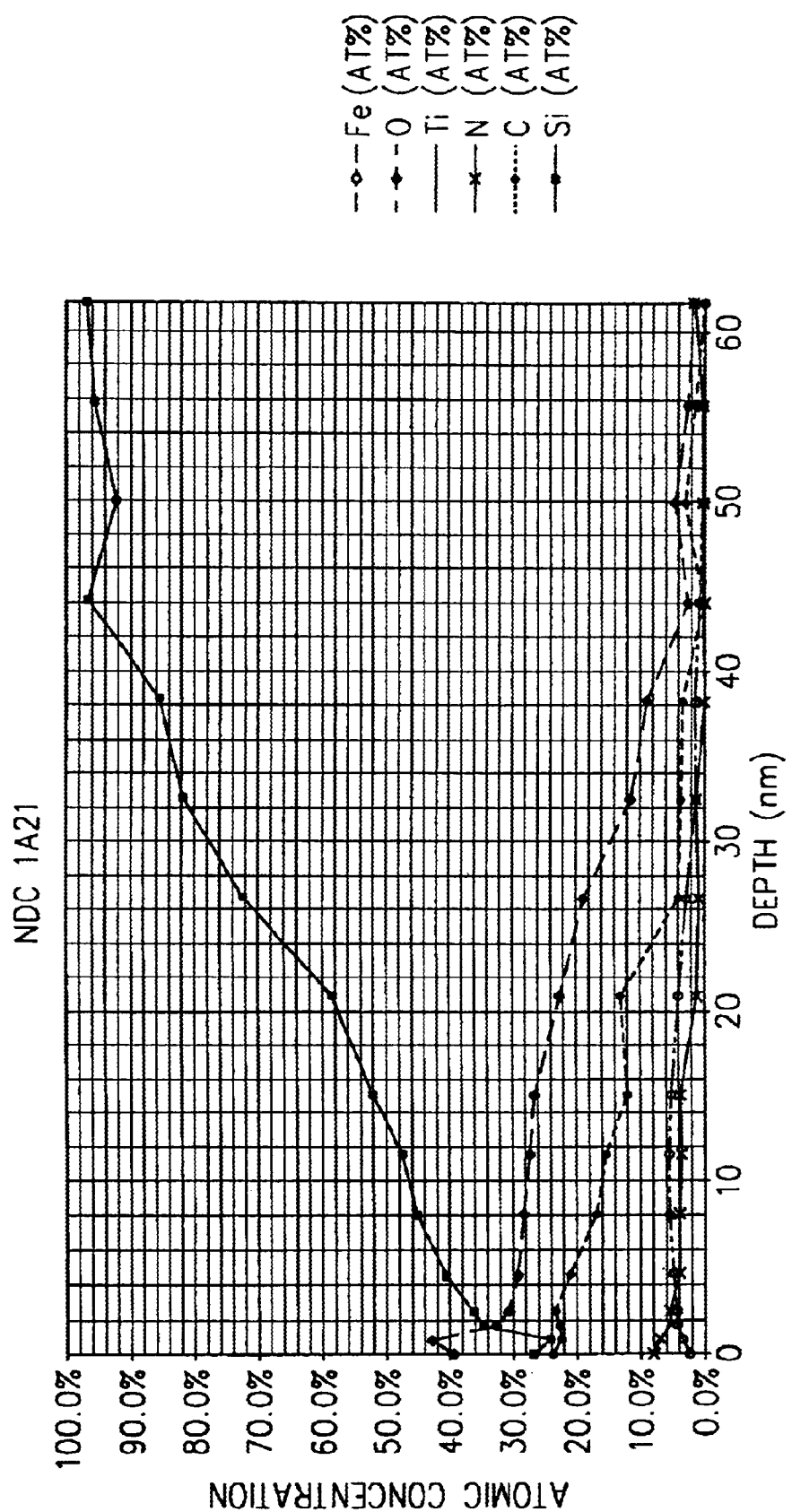
FIG. 7 is a XPS depth profile of an oxide grown for 6 minutes using a growth solution made of 3 volume parts of 5% (by wt) aqueous $(NH_4)_2SiF_6$, as the silicon source, 2 volume parts of 60% HTiF solution, and 2 volume parts of 5% KFeCN aqueous solution.

FIG. 7 is a XPS depth profile of an oxide grown for 6 minutes using a growth solution made of 3 volume parts of 5% (by wt) aqueous $(NH_4)_2SiF_6$, as the silicon source, 2 volume parts of 60% HTiF solution, and 2 volume parts of 5% KFeCN aqueous solution. As seen, as compared to the SiOX film in FIG. 3, the surface Fe concentration is noticeably lower. The lower growth rate of the SiOX film compared to that of the film in FIG. 3 (7.5 nm/min vs about 16 nm/min, respectively), is due to the low concentration of the $(NH_4)_2SiF_6$, silicon source Si source used for the growth of the SiOX film in FIG. 7. When 15% (by wt) aqueous $(NH_4)_2SiF_6$, was used the Dektak generated thickness of the SiOX film, grown also for 6 minutes, was about 2.05 times higher than that in FIG. 7, which translates into a relative growth rate close to the one of the SiOX film in FIG. 3.

For various potential applications the metallic impurity concentration in the SiOX film have to be of the order of parts per billion level. For further lowering the metallic impurity concentration, while avoiding the organic components such as n-BCPl, we have explored several approaches. These include adding various non-invasive components to the growth solution which to prevent or minimize the incorporation of the metallic and non-metallic impurities within the SiOX film. Some of the potential solutions to this problem will be examined below.

Figure 8:
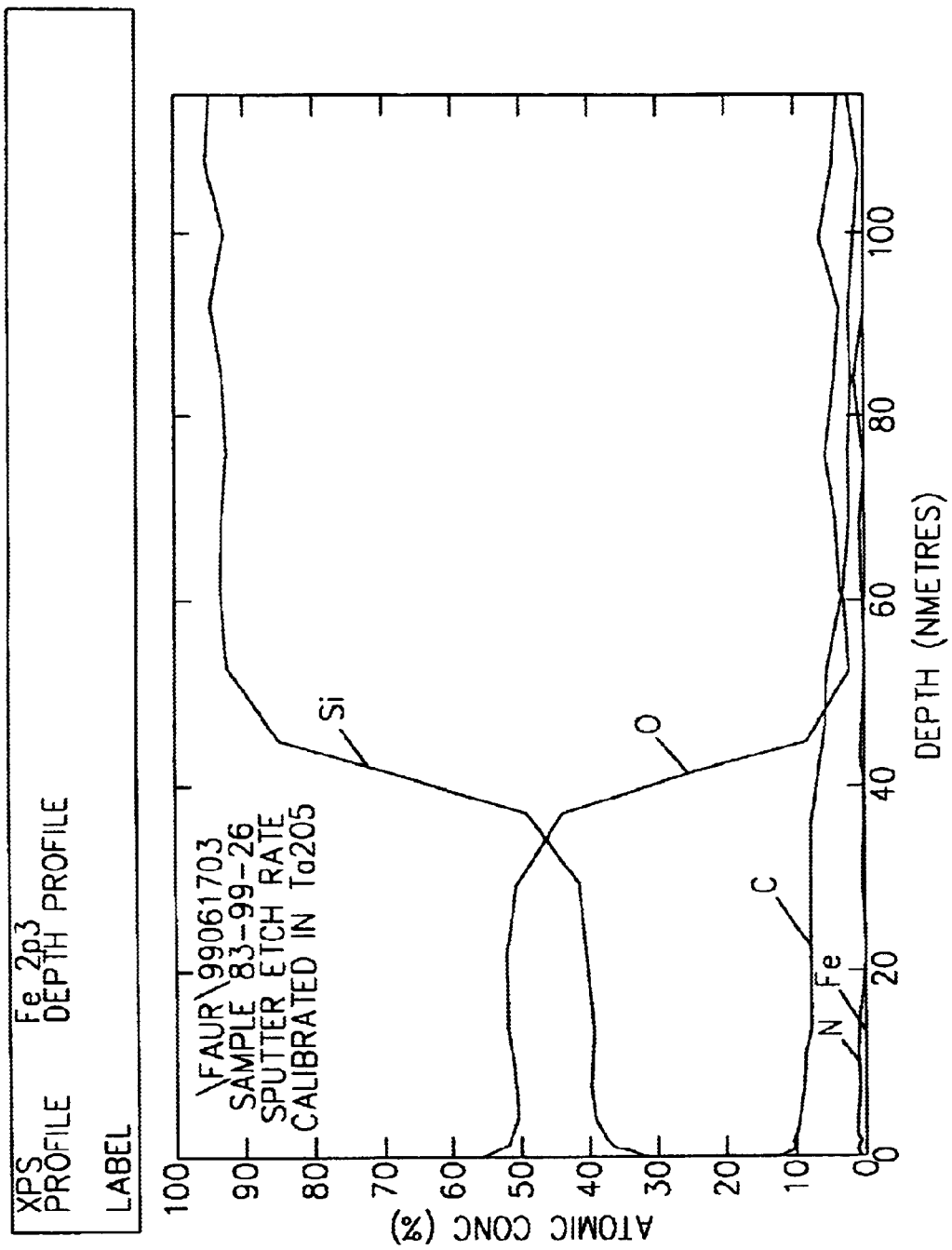
FIG. 8 is a XPS depth profile of a SiOX thin film grown for 7 minutes using a growth solution made of: 9 volume parts of 34% HSiF, 6 volume parts of 60% HTiF solution, 6 volume parts of 5% KFeCN aqueous solution, and 4 volume parts of 25% $H_2SO_4$.

FIG. 8 is a XPS depth profile of a SiOX thin film grown for 7 minutes using a growth solution made of: 9 volume parts of 34% HSiF, 6 volume parts of 60% HTiF solution, 6 volume parts of 5% KFeCN aqueous solution, and 4 volume parts of 25% $H_2SO_4$. No sulfur could be detected in this film either by XPS or AES. In exchange, the Fe concentration of the above SiOX film has dropped dramatically compared to the film such as in FIG. 3, where no $H_2SO_4$ was used. A comparable reduction in the Fe content was obtained when 1 part rather than 4 parts of 25% $H_2SO_4$ was added to the growth solution, while also increasing the growth rate of the SiOX film using 1 part 25% $H_2SO_4$ by a factor of almost 1.5 compared the SiOX film in FIG. 8. Although not quite as large as above similar reductions of the Fe, and Ti metallic impurities were obtained by adding 0.5 to 5 parts of 10% HCl solution instead of the $H_2SO_4$ solution to the growth solution in FIG. 8.

Figure 9:
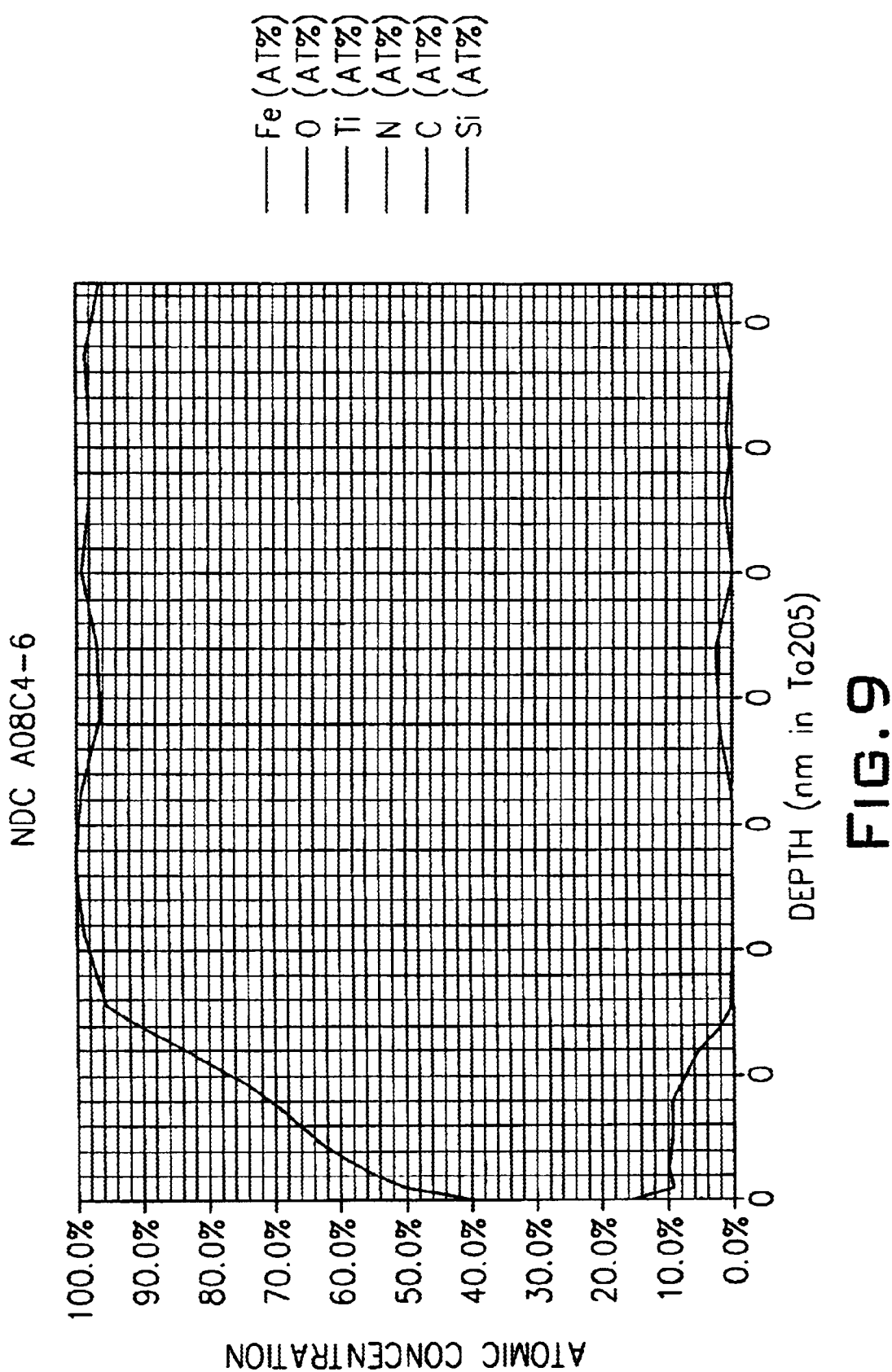
FIG. 9 is a XPS depth profile of a SiOX thin film grown for 6 minutes using a growth solution made of: 3 volume parts of 34% HSiF, 2 volume parts of 60% HTiF solution, 2 volume parts of 5% KFeCN aqueous solution, 1 volume part of DI water, and 0.6 volume parts of 8% $H_2O_2$, 0.3 volume parts of 4% aqueous solutions.

A further reduction of the Fe concentration in the SiOX film was obtained when small volumes of $H_2O_2$ was added to the growth solution above using 0.5 to 5 parts of 10% HCl solution. An example is given in FIG. 9 which is an XPS depth profile of a SiOX thin film grown for 6 minutes using a growth solution made of: 3 volume parts of 34% HSiF, 2 volume parts of 60% HTiF solution, 2 volume parts of 5% KFeCN aqueous solution, 1 volume part of DI water, and 0.6 volume parts of 8% $H_2O_2$, 0.3 volume parts of 4% HCl aqueous solutions. Only trace amounts of Fe and Ti concentrations could be detected using this growth solution. However the growth rate of the SiOX film is about three times lower than when using an otherwise similar growth solution, but without the $H_2O_2$ component. When smaller amounts of the $H_2O_2$ components (e.g. 0.1 to 0.5 volume parts of 8% $H_2O_2$), the SiOX growth rate increased noticeably, with no significant increase in the Fe and Ti concentrations. When below 0.1 volume parts rather than the 0.6 volume parts of the $H_2O_2$ component in FIG. 9 were used, both the Fe and Ti concentrations started to increase noticeably.

Figure 10:
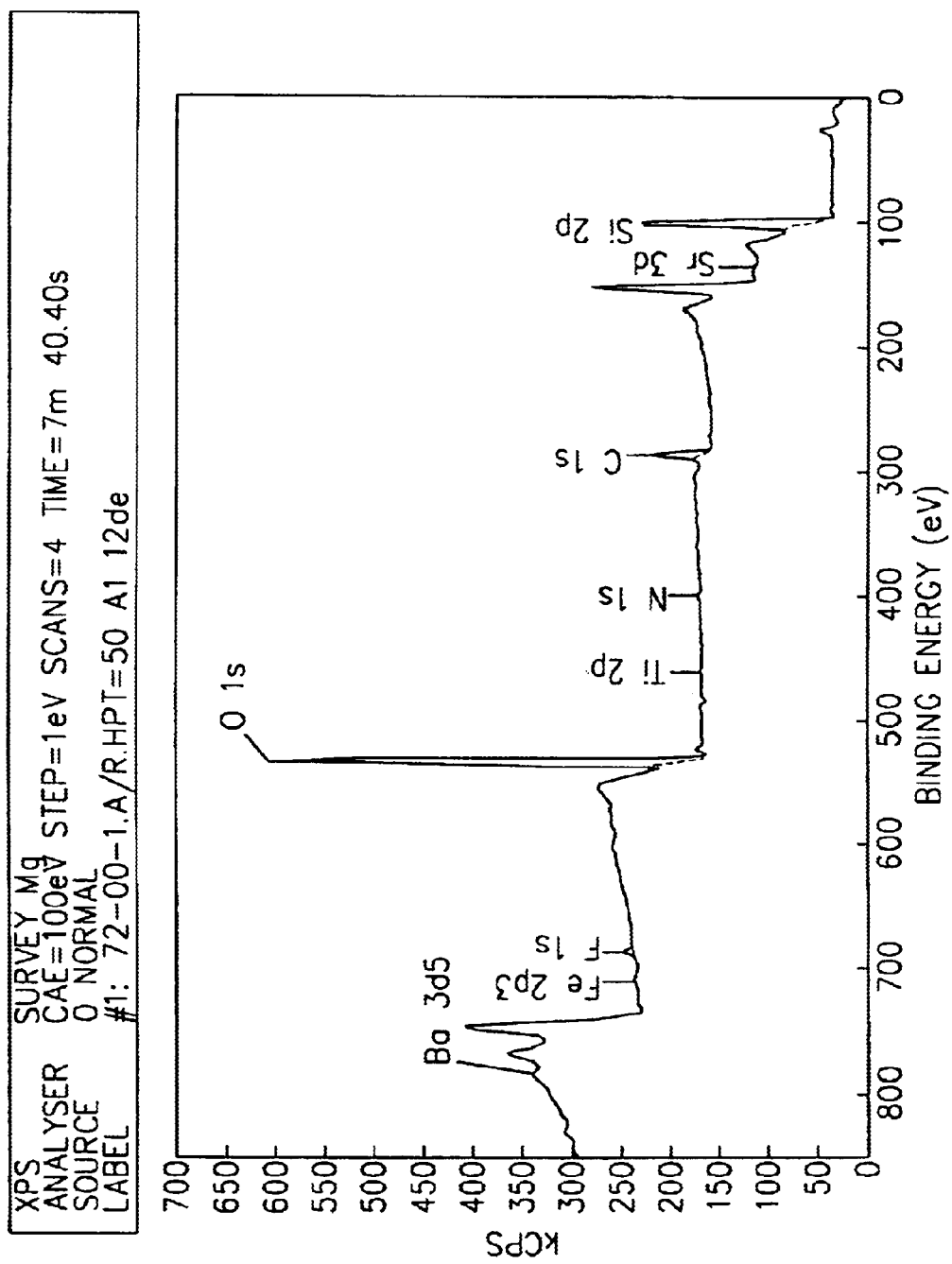
FIG. 10 are plots of reflectivity against wavelength of cell in FIG. 9 with (a) bare and (b) RTWCG SiO-based AR coating.

Although for applications such as the first oxide the presence of the HCl and $H_2SO_4$ components in the growth solution should not pose any compatibility problems, for other applications remaining non-reacted such components would make the RTWCG SiOX process incompatible with various materials such as photoresists and metallization. Hence, for these applications alternative growth solutions that should lower the metallic and non-metallic impurity concentration are necessary. For example, by adding 1 volume part of 10% by weight $TiCl_4$ aqueous solution to the growth solution in FIG. 3, the surface Fe concentration has dropped to 0.152% and the surface Ti concentration to 0.047%. However, in this case, trace amounts of Ba (0.041%), and Sr (0.041%) were found at the surface of the SiOX film. The source of Ba and Sr in this case could only come from the technical grade $TiCl_4$ aqueous solution component that we used for this experiment. In order to see if heavy metals such as Ba are incorporated in some larger concentration in the SiOX film, we repeated the example above, that is we added 1 volume part of 10% by weight $TiCl_4$ aqueous solution, and 1 volume part each of 1M $BaCl_2$ and 1M $SrCl_2$ aqueous solutions to the growth solution in FIG. 3. FIG. 10 is a XPS surface survey of the SiOX film (about 90 nm thick) grown for 5 minutes using the above growth solution. The Fe, Ti, Ba, and Sr surface concentrations were 0.122%, 0.048%, 0.018%, and 0.114% respectively. Surprisingly, the Ba concentration has actually decreased compared to the example above, when no source of Ba was intentionally included in the growth solution. The Sr concentration, as expected slightly increased when the $SrCl_2$ source was used, while the Fe concentration further decreased.

We found that a large class of $Me^{3+}/Me^{5+}$ redox systems from a variety of precursors, including but not restricted to the transitional metallic ions mentioned above such as Ti, Co, V, Cr, Fe, Ni, Cu, Y, Sr, Ce, Ba, Zr, Nb, Ru, Rh, and Pd can be used for this purpose.

Figure 11:
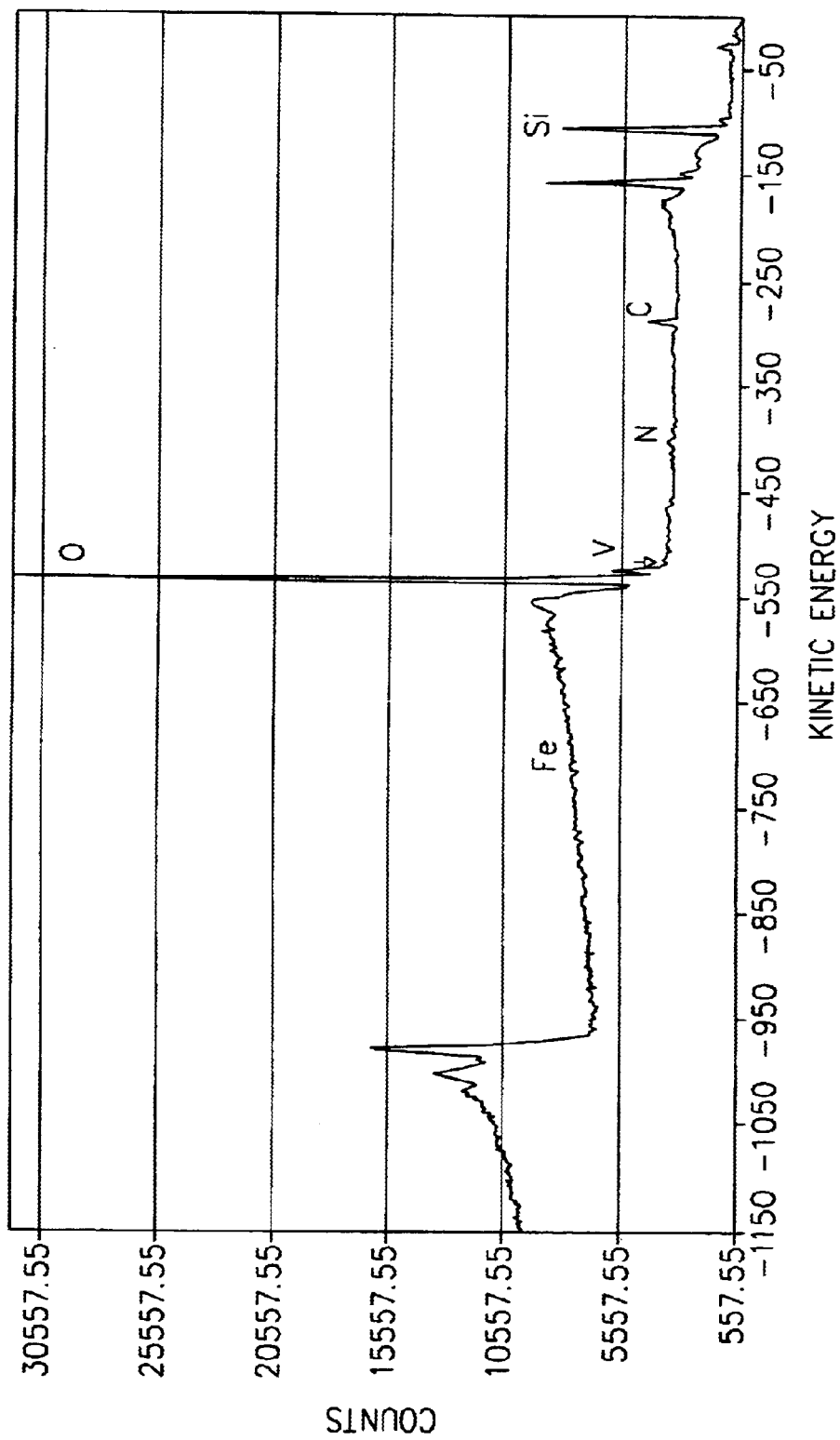
FIG. 11 is a XPS depth profile of a SiOX thin film grown for 10 minutes using a growth solution made of 5 volume parts of 34% HSiF, 4 volume parts of 60% HTiF solution, 4 volume parts of 10% KFeCN aqueous solution, and 3 volume part of 3.5% HCl saturated with $V_2O_5$ aqueous solution.
Figure 12A:
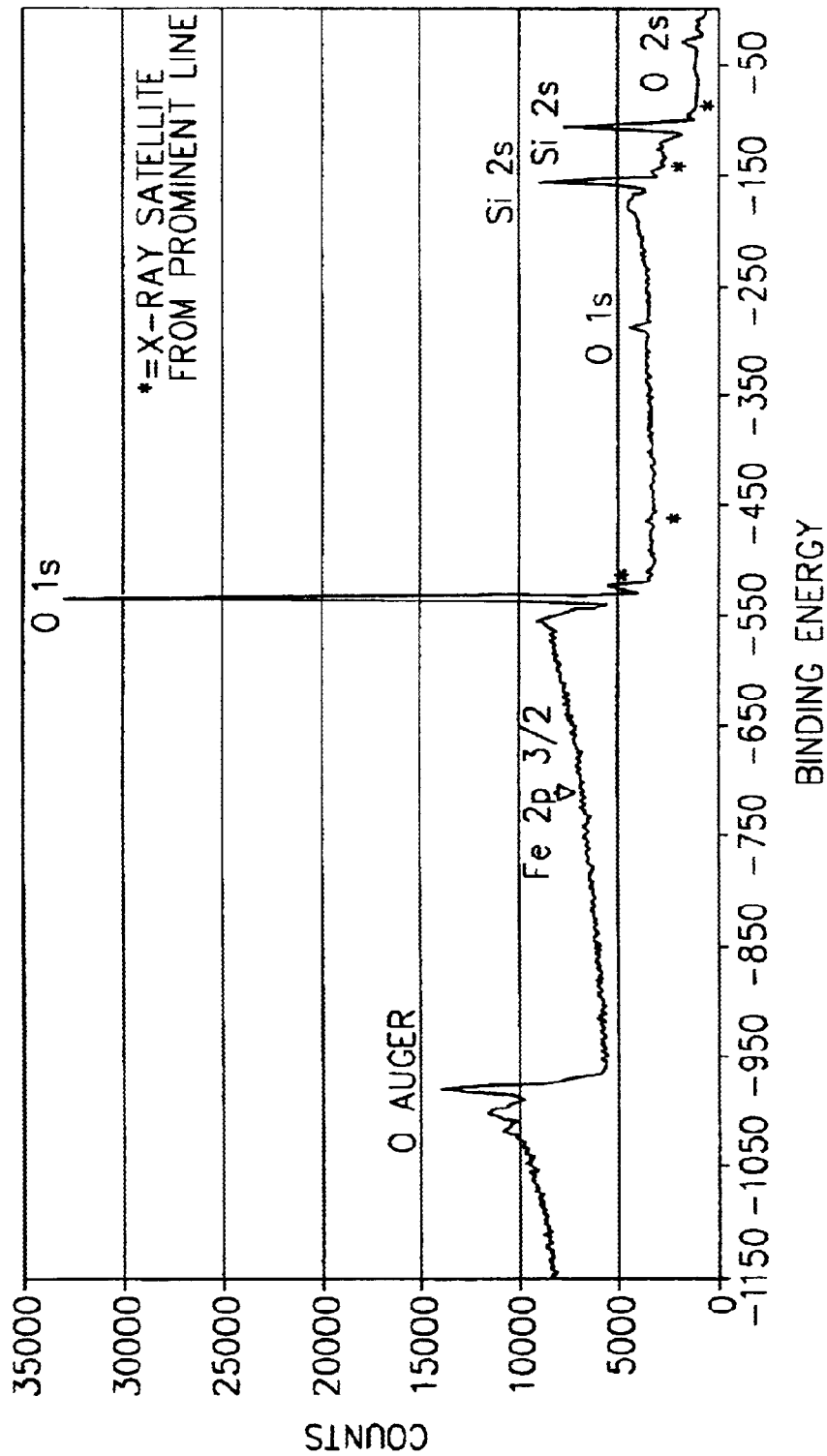
FIG. 12a is a XPS surface survey and FIG. 12b is a XPS depth profile of a SiOX thin film grown for 10 minutes using a growth solution made of 6 volume parts of 34% HSiF, 4 volume parts of 60% HTiF solution, 4 volume parts of 10% KFeCN aqueous solution, and 3 volume part of 3.5% HCl saturated with $Co_3O_4$ aqueous solution.
Figure 12B:
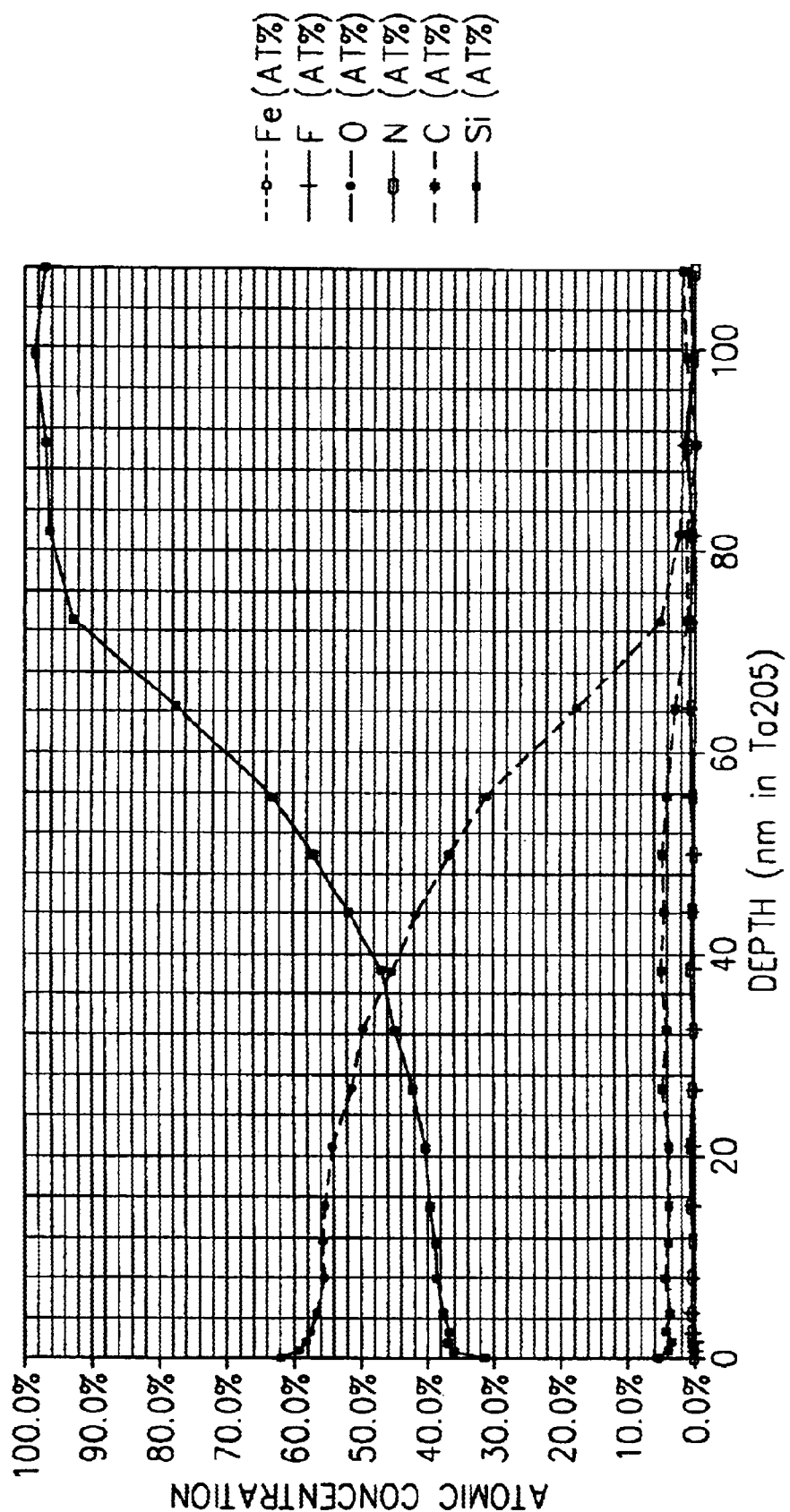

FIG. 11 is a XPS depth profile of a SiOX thin film grown for 10 minutes using a growth solution made of 5 volume parts of 34% HSiF, 4 volume parts of 60% HTiF solution, 4 volume parts of 10% KFeCN aqueous solution, and 3 volume part of 3.5% HCl saturated with $V_2O_5$ aqueous solution. The Fe surface concentration is below 0.1%, with trace amount of Ti, and no detectable V. FIG. 12a is a XPS surface survey and FIG. 12b is a XPS depth profile of a SiOX thin film grown for 10 minutes using a growth solution made of 6 volume parts of 34% HSiF, 4 volume parts of 60% HTiF solution, 4 volume parts of 10% KFeCN aqueous solution, and 3 volume part of 3.5% HCl saturated with $Co_3O_4$ aqueous solution. The XPS depth profiles on the lastest SiOX thin films show no trace amounts of Fe within the detectability limit of high performance XPS. Also, no trace amount of Co, or Ti can be found at the surface or bulk of the SiOX film. Similar results as in FIG. 12 were obtained when using other Co or V based aditives, e.g using 3 volume parts of 3.5% HCl saturated with $Co(OH)_2$ aqueous solution as a replacement of the 3 volume part of 3.5% HCl saturated with $Co_3O_4$ aqueous solution in the growth solution in FIG. 12.

The above results show that various $Me^{3+}/Me^{5+}$ redox systems mentioned above and used herein for the purpose of reducing the Fe and Ti concentration within the SiOX films are only found in trace if any concentrations in the film, and when traces of these additive metals are found they are always compounded with oxygen, nitrogen and Si. By using these redox systems, an XPS BE's analysis of various picks, it is apparent that except at the surface, and where some small concentration of non-oxidized metals such as Fe, Ti and other metallic impurities that are contained in the growth solution, in the SiOX bulk these impurities appear in a proportion of near 100% as stable compounds with nitrogen or in an oxidized form. This is also valid for SiOX films grown on other than Si substrates.

The foregoing and other objects, features and advantages of the invention will be apparent from the following more particular examples of preferred embodiments of the invention.

EXAMPLE 1

SiO-based Dielectric for Use as a Single Layer Antireflection Coating for Si-based Planar Solar Cells The anti-reflection (AR) coating is an important part of a solar cell design. It allows a substantial reduction in the amount of reflected light. It is a common practice to use physical vapor deposition techniques to deposit the AR coating. For simple cell structures, the layers of AR coating are deposited directly onto the emitter surface by resistive or e-beam evaporation, sputtering and chemical vapor deposition. The most common single layer AR coatings are $MgF_2$, $SiO_2$, SiO, $TiO_2$ and $Ta_2O_5$. For high efficiency space solar cells, the most commonly used double layer AR coating is $ZnS/MgF_2$. A proper single layer AR coating (e.g. $MgF_2$, $SiO_2$, SiO, $TiO_2$ and $Ta_2O_5$) can reduce reflection to about 10%, averaged over the 0.4 $\mu$m to 1.1 $\mu$m wavelength range. A double layer AR coating can reduce reflection to 3–5% on the average. For uncoated Si cells, a textured front surface, e.g. regularly spaced pyramids or porous silicon (PS), can lower the reflection coefficient to 12–18%. For textured surfaces with well designed single or double layer AR coatings, such as $ZnS/MgF_2$, $TiO_2/MgF_2$, and $TiO_2/Al_2O_3$ the reflection is on average down to 2–5%. Due to the difficulty of depositing uniform AR coatings on textured surfaces, some cell manufacturers are choosing not to use any AR coating. The penalty they pay is up to 10% loss in efficiency along with surface stability problems. Owing to the nanometer-sized features of the PS structure, depositing/growing uniform AR coatings on PS surfaces is even more difficult using conventional techniques.

For simple cell structures, conventional AR coating layers are deposited directly onto the emitter surface usually by physical vapor deposition and spin-on techniques. This approach destroys the stoichiometry at the cell's front surface, which by increasing the scattering at the grain boundaries, decreases the AR coating/semiconductor interface transparency, and introduces additional defects at the emitter/AR coating interface. For Si cells the above problems can be partially addressed by using a combination of a thin passivating oxide (e.g. $SiO_2$, $SiN_x$) and a single or double layer AR coating. Using this approach contributed, for example, to the improvement of the PERL one sun terrestrial Si solar cells efficiency, at the University of South Wales and at SunPower, to about 24% (AM 1.5, 25° C.), and 20.3% (AM0), respectively. The high efficiency III–V based space solar cells use a window layer grown on the surface of the emitter prior to depositing the layers of the AR coating. This window layer partially reduces the degradation effects mentioned above. Lattice-matched window layers are grown by epitaxy; this increases the cost and reduces the yield of finished cells. Radiation induced defects at the window/emitter layer interface is an additional concern for the design engineers of space solar cells.

RTWCG SiOX AR coatings are applied on the surface of the solar cell in one easy step by dipping the finished (bare) solar cell into, or by applying by spraying, or brush or roll coating a thin film of the growth solution onto the finished (bare) cells, followed in each case by a removal in DI water of the unused volume of the growth solution after the growth of the desired thickness of the SiO based AR coating, and a blow dry of the coated solar cell surfaces in nitrogen.

Figure 13:
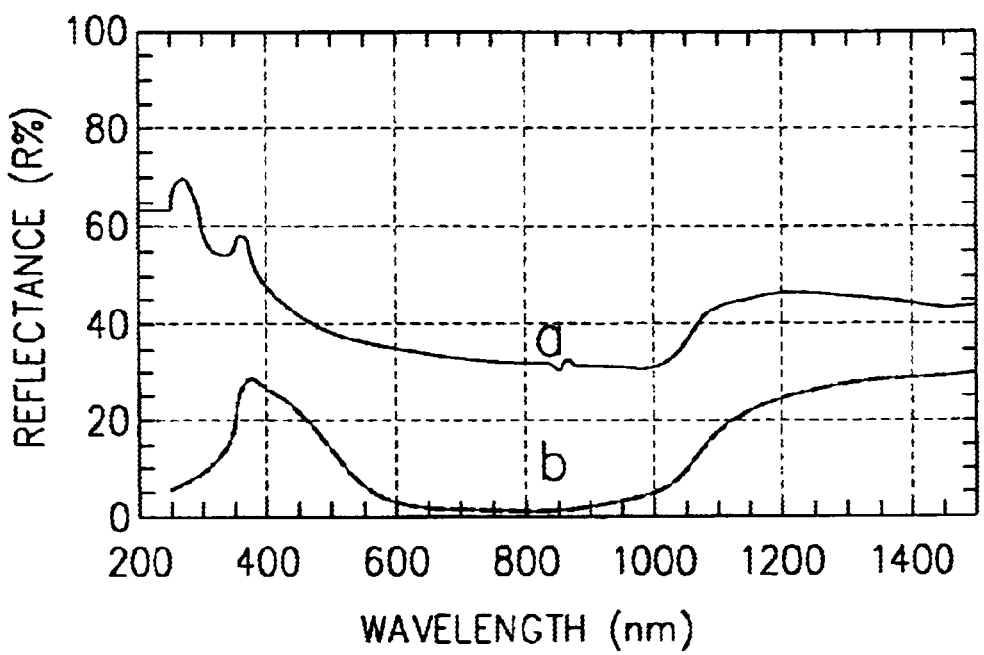
FIG. 13 shows the reflectivity of: (a) bare and (b) RTWCG SiOX (about 0.11 μm thick) coated p-Si wafer.
Figure 14:
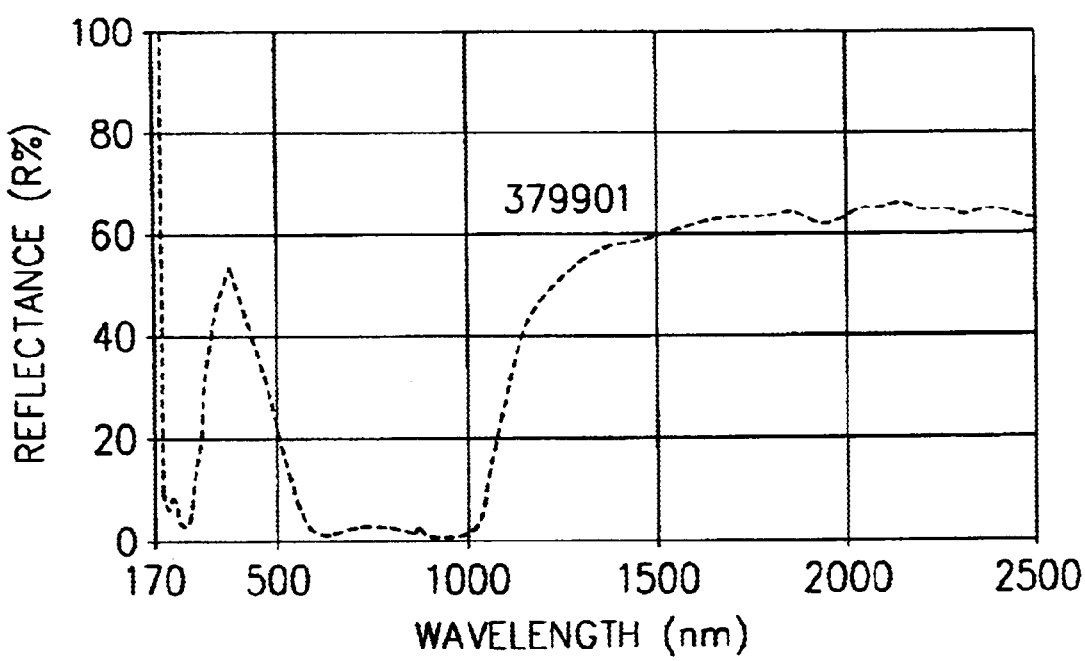
FIG. 14 Reflectivity of a 140 nm thick SiOX coating grown on a bare silicon substrate.

FIG. 13 shows the reflectivity of: (a) bare and (b) RTWCG SiOX (about 0.11 $\mu$m thick) coated p-Si wafer. For bare Si, the loss of incident light amounts to about 42% at long wavelengths (1.1 $\mu$m), has a minimum of about 37% at 1 $\mu$m, and rises to about 54% at short wavelengths (0.4 $\mu$m) (see FIG. 11-a). A proper single layer AR coating can reduce the reflection to about 10%, averaged over this wavelength range, and a double layer AR coating can reduce it to around 3% on the average. The RTWCG SiOX coating in FIG. 3-b, grown in similar conditions as the coating in FIG. 1, has a reflectivity of below 1.8% from 600 nm to 950 nm and below 3.3% on the average from 400 nm to 1100 nm. In order to minimize the working temperature of the solar cell it is desirable to increase the reflectivity of the unusable red part of the solar spectrum, while maintaining the low reflectivity in the visible. This is possible by using a slightly thicker SiOX coating. For example the 140 nm thick SiOX coating shows an increase in the red reflectivity to over 60% (see FIG. 14) while maintaining the low visible reflectivity. However, an increase in the red reflectivity produced a noticeable increase in the blue reflectivity. In order to increase the solar cell efficiency by lowering the operating temperature, a compromise can be made between the red reflectivity and blue reflectivity, while maintaining the visible reflectivity.

For our preliminary study we used several dozen readily available planar 2×2 $cm^2$ n/p Si solar cells with an AM0, 25° C. efficiency of about 7% (bare cells). RTWCG SiOX coatings were grown for 3 to 5 minutes using several chemical systems. The performance parameters were measured under AM0, 25° C. conditions at NASA GRC prior to and after the coatings. A selection of the performance parameters can be found in Table 2. After the RTWCG SiOX coating, the only treatment the cells received prior to the AM0 measurements was a DI water rinse and followed by $N_2$ drying.

The increase in AM0 efficiency of coated relative to bare cells was from 32% up to 37.3%. For these cells the gain in efficiency was mostly due to corresponding gains in $I_{sc}$, with little or no change in $V_{oc}$ or FF values. The explanation might have to do with the fact that the surfaces of the 15-year old planar cells could not be properly cleaned, prior to growing the SiOX coating, without removing some or all front grid fingers. For instance, a one minute dip in 5% HF solution started to remove some of the front grid fingers. To avoid this, prior to the AM0 measurements, the front surfaces of the bare cells were only cleaned with organics, followed by a few seconds dip into a 2% HF bath. This surface treatment may have left some contaminated native oxide on the surface. This might explain the apparent lack of surface passivation provided by the SiOX coating.

TABLE 2

AM0, 25° C. performance parameters of selected 2 × 2 cm² n/p Si cells prior to (bare) and after RTWCG of SiOX coatings. Growth time: 3 to 5 minutes; Oxide thickness: 95 to 120 nm; No annealing.

| Cell | Bare Cell | | | | Coat. Cell | | | | ($\eta$,ox-$\eta$,bare)/$\eta$,bare (%) |
|---|---|---|---|---|---|---|---|---|---|
| | $I_{sc}$ (mA) | $V_{oc}$ (mV) | FF (%) | $\eta$ (%) | $I_{sc}$ (mA) | $V_{oc}$ (mV) | FF (%) | $\eta$ (%) | |
| Cox 12 | 89.2 | 583.9 | 75.2 | 7.16 | 118.9 | 579.5 | 75.0 | 9.45 | 32.0 |
| Cox 27 | 88.0 | 573.1 | 70.4 | 6.49 | 117.2 | 572.7 | 71.8 | 8.81 | 35.7 |
| Cox 23 | 88.3 | 570.9 | 68.7 | 6.33 | 119.9 | 571.0 | 69.5 | 8.69 | 37.3 |
| Cox 12 | After 16 months in air in a | | | | 121.8 | 573.7 | 72.6 | 9.27 | |
| Cox 23 | chemistry laboratory environment | | | | 119.8 | 566.6 | 67.2 | 8.35 | |

In Table 2 are also shown the AM0 performances of two of the cells, Cox 12 and Cox 23, after being stored in air in a chemistry laboratory environment for about 16 months. As can be seen, the $I_{sc}$ is practically unchanged, while the drop in $V_{OC}$ and FF are to be expected due to humidity and contaminants adsorbed on the surfaces.

EXAMPLE 2

SiO-based Thin Films for Use as a Single Layer AR Coating for VMJ Si Solar Cells Vertical MultiJunction (VMJ) Si solar cells, (U.S. Pat. Nos. 4,332,973; 4,409,422, and 4,516,314) show a good promise for use as concentrator solar cells. One of the biggest challenge in fabricating high efficiency, stable VMJ cells is the difficulty, using traditional techniques, to passivate the two back and front surfaces, and the two non-metallized edge surfaces. The biggest contributor to efficiency loss in the Si VMJ cell structure is the fact that its illuminated and back surfaces are high recombination surfaces with exposed junctions which are difficult to passivate by means of thermal oxidation. This is because thermal oxidation needs a temperature that is higher than the temperature at which the stack is alloyed together. Additionally, as known for these cells, degradation by nonionizing (subbandgap) radiation (as far as the dielectrics tantalum pentoxide and silicon nitride are concerned) makes the cell performance parameters decrease significantly with time, especially if UV or near UV radiation are not completely absorbed by the cover glass and/or encapsulant.

For this preliminary experiment we used some early Vertical MultiJunction (VMJ) Si solar cells, which were provided to us by PhotoVolt, Inc. The biggest contributor to efficiency loss in the Si VMJ cell structure is the fact that its illuminated surface, the back surface, and two edge surfaces uncovered by metallization are high recombination surfaces with exposed junctions that are difficult to passivate. Also, traditional AR coatings are difficult to form on these cells because of temperature constraints and because of their configuration with the four exposed surfaces.

The RTWCG process grows SiOX coatings simultaneously on the four exposed surfaces. The performances on both sides of a Si VMJ cell in Table 3 were measured by PhotoVolt, Inc. after cleaning and etching the bare "PV4-14-x" cell. The performances were measured after growing a RTWCG SiOX coating such as in FIG. 1 for three minutes, and subsequently for additional 0.5 minutes each, during the second and third growth.

After the initial 3 minutes growth the thickness of the Si—O—C—N oxide was evaluated from the color code at about 100 nm. The second and third growth each successively added about 15 nm to the thickness. After each growth, the only treatment the cell received was a rinsing in DI water and nitrogen drying.

After the measurements, following the second growth, the cell was measured again after two minutes under light. This slightly increased the cell performance parameters due to a partial removal of humidity from the cell surfaces. The drop in performances after the third growth is consistent with reflectivity plots, such as in FIGS. 13 and 14, which were acquired on SiOX coated Si surfaces with an oxide of about 110 nm and 140 nm thick, respectively. After the third growth, annealing the cell for 10 minutes in air increased all performance parameters noticeably. However, after a subsequent overnight annealing under similar conditions as above, no further change in the cell parameters was noticed. The short time illumination and the annealing experiments, might indicate the fact that the Si—O—C—N oxide is only hydrated at the surface. The aproximately 15 hour annealing in air at 100° C. gives a qualitative indication of the good stability of this room temperature oxide.

TABLE 3

Performance parameters of a bare and RTWCG Si—O—C—N coated VMJ Si concentrator cell (PV4 -14 -x). PhotoVolt, Inc. performed the initial etching and surface cleaning of the bare cell surfaces, as well as the performance parameter measurements.

| | Etched and Cleaned | 1st Growth 3 min | 2nd Growth | | 3rd Growth | |
|---|---|---|---|---|---|---|
| | | | Additional ½ min Growth | After 2 min Under Light | Additional ½ min Growth | 10 min Annealing In Air At 100* C |
| Side 1 | | | | | | |
| $V_{oc}$ (V) | 8.786 | 9.883 | 9.641 | 9.659 | 9.239 | 9.272 |
| $I_{sc}$ (mA) | 0.17 | 0.34 | 0.30 | 0.31 | 0.26 | 0.33 |
| FF | .5365 | 0.6073 | 0.579 | 0.579 | 0.5575 | 0.5570 |
| $P_p$ (mW) | 0.779 | 2.022 | 1.66 | 1.712 | 1.321 | 1.699 |
| Side 2 | | | | | | |
| $V_{oc}$ (V) | 8.699 | 9.672 | 9.951 | 9.909 | 9.363 | 9.575 |
| $I_{sc}$ (mA) | 0.15 | 0.30 | 0.33 | 0.35 | 0.28 | 0.35 |
| FF | .5139 | 0.5934 | 0.6005 | 0.6029 | 0.5660 | 0.5775 |

TABLE 3-continued

Performance parameters of a bare and RTWCG Si—O—C—N coated VMJ Si concentrator cell (PV4 -14 -x). PhotoVolt, Inc. performed the initial etching and surface cleaning of the bare cell surfaces, as well as the performance parameter measurements.

| | | 2nd Growth | | 3rd Growth | |
|---|---|---|---|---|---|
| Etched and Cleaned | 1st Growth 3 min | Additional ½ min Growth | After 2 min Under Light | Additional ½ min Growth | 10 min Annealing In Air At 100* C |
| $P_p$ (mW) 0.672 | 1.741 | 1.989 | 2.095 | 1.494 | 1.919 |

Note that contrary to the planar cells, the $V_{OC}$ and FF values for the VMJ cell increased significantly after the coating. These values, and the large increase in Isc, after coating, cannot be explained simply by a reduction of optical-type losses. They offer a clear indication that surface passivation plays an essential role in increasing the maximum power (Pp) as much as three fold compared to that recorded for the bare cell.

EXAMPLE 3

Surface Passivation of Silicon Surfaces

If various dielectric layers are deposited/grown directly on the Si surface it is imperative that they provide good passivation of the surface. This is difficult to achieve for future IC electronic and optoelectronic structures with shrinking feature size using traditional insulator growth/deposition techniques. For example, for the development of electronic and optoelectronic devices with critical features below 100 nm, the thickness of various dielectric layers (e.g. gate dielectrics) must be scaled down accordingly, but still retain or improve their passivating, as well as its insulating and stability properties. For nanoelectronics none of the thin film dielectric layers deposited/grown using traditional techniques can meet all the above requirements.

Without any need for post-growth annealing, the RTWCG process has the potential to produce SiOX coatings that are chemically stable and passivate well the Si surfaces. However, both the chemical stability and passivating properties of these SiOX coatings depend on their chemical composition which is in turn dependent on the chemical system being used. The SiOX thin film dielectrics in FIG. 12 should be good candidates for surface passivation for most IC applications.

If well controlled, the SiOX thin film dielectrics grown at room temperature using the novel RTWCG technique, and in particular the SiOX films using growth solutions that do not a contain any organic additives, will have improved passivating properties of Si surfaces, compared, for example to other thin film dielectrics deposited at low temperatures such as CVD and organic based spin-on glasses, because the chemical growth should result in well-defined noncrystalline layers with short range order.

No in-depth investigation of the RTWCG SiOX/Si interface has been performed thus far. However, the good passivating properties of the RTWCG SiOX coatings on Si substrates are suggested by an analysis of coated devices, e.g. the improvements in the performance parameters of VMJ Si cells, as shown above. Since the new SiOX thin films such as in FIG. 12 have low metallic and non-metallic impurities, one can expect that the passivating properties of these films will be even better compared to the thin SiOX film in FIG. 1 that was used for coating the VMJ Si solar cells above.

EXAMPLE 4

SiO-based Dielectric for Intermetallic Dielectric (IMD) and Shallow Trench Isolation for Ultra Large Scale Integrated (ULSI) Silicon Based Microelectronics Materials research on RTWCG SiOX thin film dielectric layers grown at room temperature on large area Si devices will open up a wide variety of new electronics and microelectronic device design possibilities, which are currently not available using dielectric layers grown/deposited by thermal oxidation, chemical vapor deposition, epitaxy and other traditional techniques. The foremost concerns driving the long-term trends in these areas are: (i) the material's dielectric constant, (ii) the temperature at which the insulator is grown/deposited and (iii) the incompatibility of the present technologies with the requirements of ICs with critical features below 0.1 μm. The areas where the manufacturing challenges appear to be the greatest and for which the room temperature WCG processes will have the greatest impact are: (i) thin film stable coatings such as passivating layers and gate insulators, (ii) intermetal dielectric (NMD) and (iii) DRAM capacitors.

Integrated circuit miniaturization continues to well bellow the half-micron level in the quest for higher speed and greater efficiency. At such reduced dimensions, the relatively high dielectric constant and resulting capacitance of conventional interlayer dielectric materials work to limit signal speed, create cross-talk and consume excessive power.

In the last two decades or so, there has been a continuous search for an alternate gate dielectric to $SiO_2$ grown by thermal oxidation, needed for a series of applications such as the high speed, high performance large scale integrated (LSI), very large SI (VLSI) and ultra large SI (ULSI) circuit processes. The search continues for alternate to $SiO_2$ layers and process technologies for 0.25 μm and beyond microelectronics. The high-density plasma CVD (HDP-CVD) deposited SiOF has already been used to fill 0.35 μm gaps, and is also a contender for the 0.25 μm and even for the 0.18 μm gaps, although it has proven very difficult to implement even for the 0.25 μm gaps due to problems associated with the chemical-mechanical planarization (CMP) process. Hence, a selective growth of SiO-based films for fully planarized multilevel interconnections so as to eliminate the CMP process is very attractive for VLSI and ULSI device applications.

For 0.18 μm , 0.13 μm, 0.10 μm and beyond, work is under development on a variety of materials that can provide dielectric constants between 2 and 3 (e.g. fluorinated polymides; non-polymide C—H polymers; fluoro-polymers; siloxane polymers and parylenes, to name a few). All of these materials are just now beginning to be fully characterized, and, so far, the biggest common concern is their relatively poor thermal stability.

The main disadvantages of conventional insulating films for VLSI (ULSI) applications include:

poor compatibility with multilevel interconnection, postdeposition planarization introduces stress, as well as chemical and particle contamination relatively poor thermal, UV, and plasma stability.

high temperature; low growth (deposition) rate relatively poor step coverage, high investment cost Using the RTWCG process we were able to grow SiOX dielectric layers on 2 to 8-inch p-Si and n-Si substrates. These dielectric layers have:

a thickness from about 0.01 to 1.5 µm (as determined from ellipsometry)

a growth rate of up to 100 nm/min.

measured static dielectric constant between 2.95 and 4.8 very good uniformity good chemical and thermal stability

In developing the RTWCG processes for room temperature growth of SiOX based dielectrics, the chemical composition and the chemical structural features of the liquid molecules must ensure the proper length, reactivity, permanent dipole momentum and surface tension so allow uniform growth of stable oxide layers of controllable composition and thickness. For example because the dielectric film is grown in liquid state, if the liquid precursors of the growth solution are properly selected, the surface tension forces inside spaces with critical features of 0.25 µm and beyond and high aspect ratio will pull the film flat—a selfplanarization effect. This is extremely important for developing self-planarizing growth processes of intermetallic dielectric films, and shallow trench isolation of ULSI Si-based micro- and nano-electronics.

We have been able to prove that the RTWCG SiOX oxide layers can be made compatible with metallization schemes, including Cu, and photoresists. Due to its excellent gap filling capability, this room temperature process could become the process of choice for fully planarized multilevel interconnections for ULSI microelectronics with high aspect ratio and features size of 100 nm and beyond, for which none of the presently known techniques seem to work.

For these and other microelectronics applications such as gate oxides, the impurity concentration of various trace level metallic and non-metallic impurities still existent in the SiO based oxide layers grown using the RTWCG has to be further reduced.

The three sets of TXRF data from Balazs Labs shown in Table 4 indicate significant progress in reduction of Fe and other contaminants present in the RTWCG SiOX thin films (about 250 nm thick each grown on 4-inch Si wafers. The initial sample refers to a SiOX film using a growth solution made of 5 volume parts of 34% HSiF saturated with silica, 2 volume parts of 60% HTiF solution, 1 volume part of 3% n-BPCl, and 2 volume parts of 10% KFeCN aqueous solution. The second set of TXRF data refers to films grown using a growth solution such as in FIG. 1, and a growth solution made of 1 volume part of 34% HSiF, 2 volume parts of 60% HTiF solution, 2 volume parts of 5% KFeCN aqueous solution, and 1 volume part of DI water, respectively. The third set of the of TXRF data refers to a SiOX film grown using the growth solution in FIG. 12.

TABLE 4

TXRF data of as-grown RTWCG SiOX coatings.
All data are in 1E10 atoms/cm² units:

| Parameter | Initial Sample (One spot) | 2-nd set (Two samples, two spots each*) Best(a) | 2-nd set Worse (b) | 3-rd set (Two samples, one spot each, in the center) 1-st sample | 3-rd set 2-nd sample |
|---|---|---|---|---|---|
| Sulfur (S): | | 570 | 4,800 | 560 | 170 |
| Chloride (Cl) | | 1,300 | 1,200 | 4,000 | 2,100 |
| Potassium (K) | 17,000 | — | 38 | — | — |
| Calcium (Ca) | 11,000 | 200 | 410 | 39 | 79 |
| Titanium (Ti) | 99,000 | 9,600 | 12,000 | 3,000 | 4,000 |
| Vanadium (V) | 22 | 100 | 2,300 | — | 26 |
| Chromium (Cr) | 110 | 2 | 28 | 3.6 | 0.8 |
| Manganese (Mn) | 33 | 160 | 2,400 | 6.1 | 8.1 |
| Iron (Fe) | 210,000 | 17,000 | 180,000 | 3,500 | 2,000 |
| Cobalt (Co) | 3.3 | 180 | 2,000 | 80 | 35 |
| Nickel (Ni) | 110 | 160 | 2,200 | 13 | 7.6 |
| Copper (Cu) | 390 | — | — | 190 | 14 |
| Zinc (Zn) | 1,600 | 50 | 150 | 190 | 30 |

*The difference in impurity concentration on the two spots (center and 1/2 R) of the same sample is less than 5%. (a), and (b) in column 3 represents best (first sample) and worse (second sample) of the two spots on each sample in terms of the Fe concentration.

The second set of TXRF data shows a noticeable reduction (by a factor of 12) of contaminants in the films (compared to initial TXRF data). For example, the surface Fe density decreased from about 2.2E+5 atoms/cm2 to about 1.7E+4 atoms/cm2.

The last TXRF data analysis on two coated wafers, confirms the earlier XPS surface analysis and depth profiles data. The last two low-Fe SiOX coated small area samples, in FIG. 12, have not shown any trace of Fe (within the sensitivity limit of high performance XPS).

TXRF data on some of the oxides grown/deposited on Si substrates or Si based devices using competitive low temperature techniques including LPCVD and spin-on SiO based films we found in recent published papers have higher than 2000E10 atoms/cm2 Fe concentration. This means that the last result makes our RTWCG SiOX coatings comparable to or better with some of the competitive dielectrics that are grown/deposited using conventional technique. Furthermore, as opposed to the conventional oxides, where some published XPS BE's data suggest that most of the metallic impurities are not strongly bonded to the surrounding atoms, the trace metallic impurities in the bulk of the RTWCG SiOX films form stable compounds with either Si, N, or are in a oxidized form.

For most applications, and in particular for microelectronics applications, the electric and dielectric characteristics of the oxides are the ultimate criteria for assessing the quality of the oxide. For acquiring I-V and C-V characteristics, we fabricated several series of Al/as-grown RTWCG SiOX/Si/Ti—Au (oxide thickness about 120 nm) MOS capacitors.

I-V, and C-V data, we acquired on several sets (usually 12 capacitors of 4 devices on each samples) of MOS capacitors using a top of the line I-V, C-V Keithley instrument.

On the first set, the thin film SiOX oxides with a thickness of about 100 nm were grown using the solution growth in FIG. 1. The I-V characteristics for the 12 MOS capacitors have shown no breakdown from zero to +110V applied voltage. The current density at +110V was from about 5×E-06 A/cm² to about 2×E-03 A/cm². On the negative scale breakdown occured between −50V and −75V. On the positive bias, these results compare well with or are better than known to us results from literature of so-called low temperature (growth temperature from 300 C. to 450 C.) oxides. Note that in most cases, from among many examples of I-V data we found in literature, no I-V plots are presented on the negative bias scale.

Figure 17A:
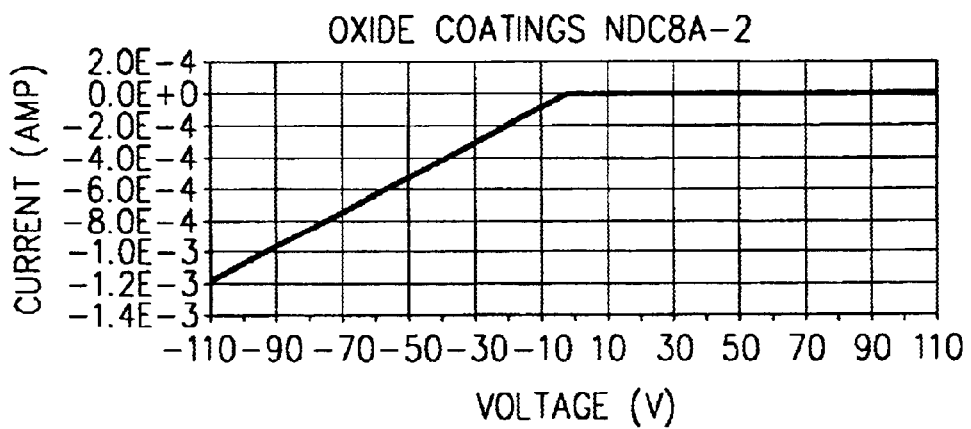
FIG. 17a is a graph of I-V characteristics for a MOS capacitor having an oxide layer grown in accordance with the invention for applied voltages ranging from –110 V to +110 V.
Figure 17B:
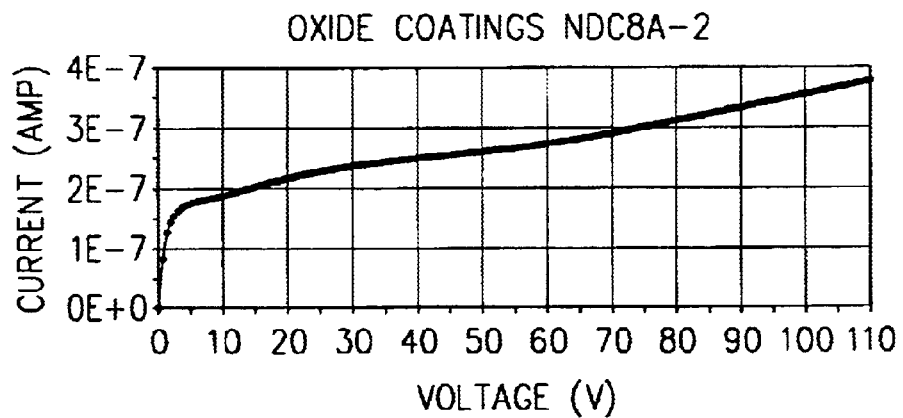
FIG. 17b is similar to FIG. 17a, but for applied voltages ranging from 0 to +110 V.
Figure 17C:
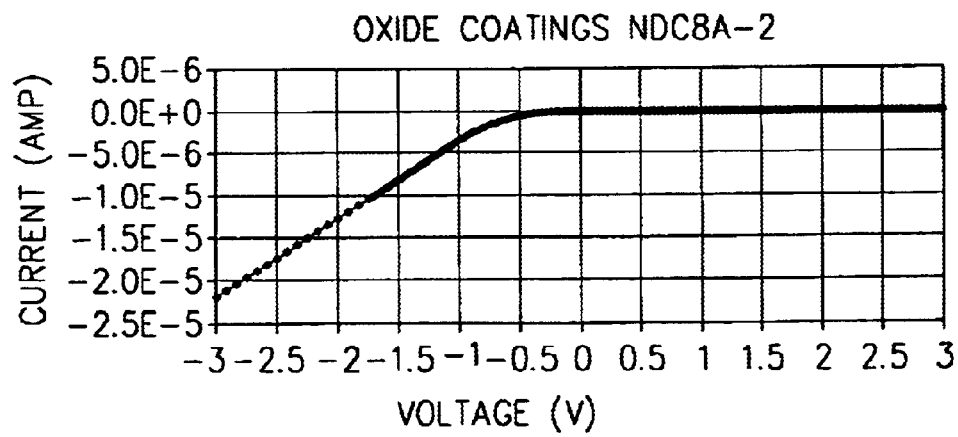
FIG. 17c is similar to FIG. 17a, but for applied voltages ranging from –3 V to +3 V.

On two sets of 6×4 Al/as-grown RTWCG SiOX/Si/Ti—Au (oxide thickness about 110 nm) MOS capacitors fabricated on as-grown oxides Au (oxide thickness about 110 nm) grown using growth solutions made of 3 volume parts of 34% HSiF, 2 volume parts of 60% HTiF solution, and respectively a growth solution in FIG. 7, no breakdown voltage was seen under positive bias voltage, up to +110V. At +110V the leakage current was from about 4×E-07 A/cm² to about 2×E-04 A/cm². Eight of these new MOS capacitors have show no breakdown voltage on the negative scale for applied voltage of up to at −110V. On the remaining four MOS devices, breakdown occured between −100V and −110V. In FIG. 17a to FIG. 17c are examples of I-V characteristics, at applied bias voltage from (−)110 V to +110 V (FIG. 17a), from 0 to +110V (FIG. 17.b), and from (−) 3 V to +3 V (FIG. 17c).

Figure 18A:
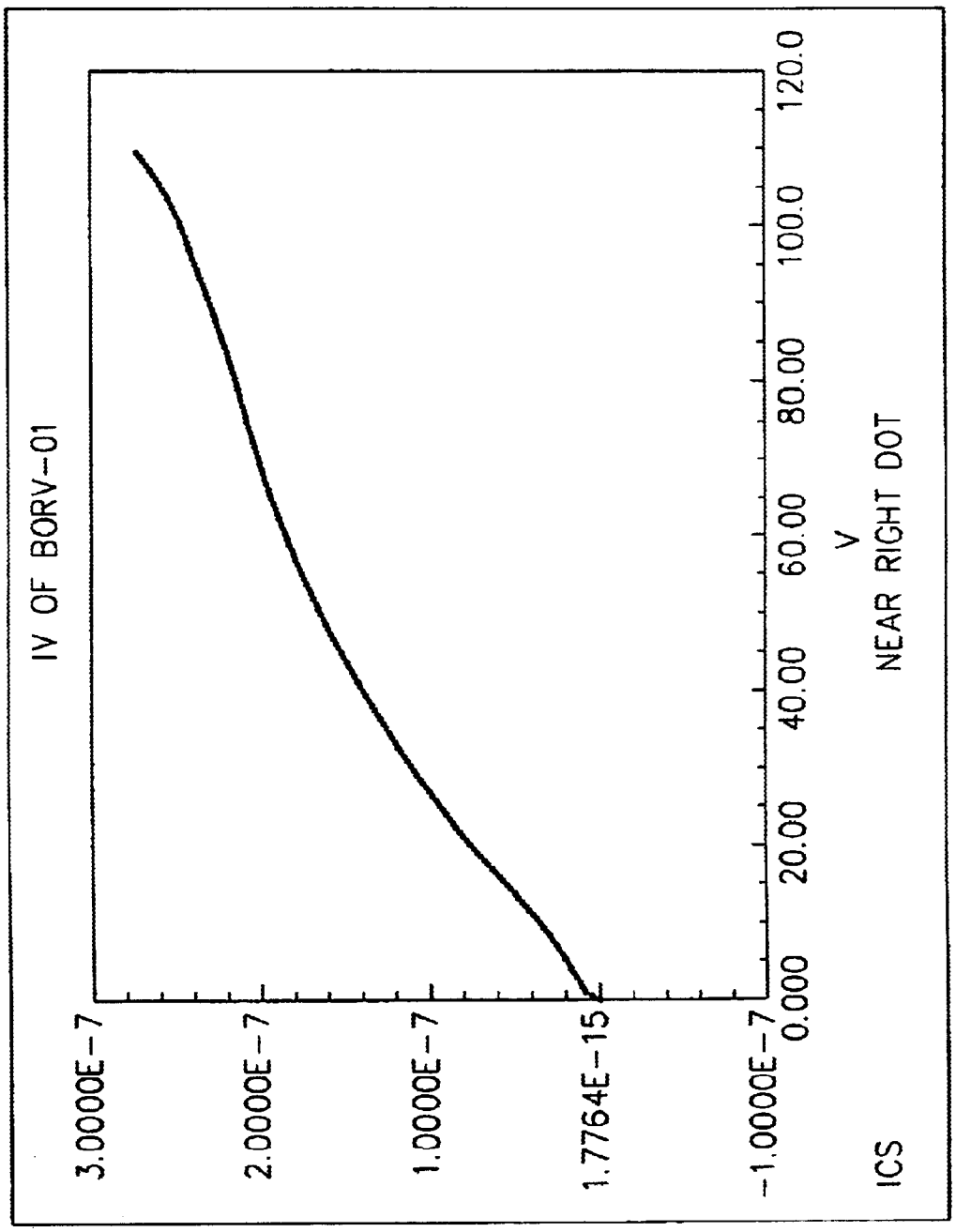
FIG. 18a is similar to FIG. 17a, but for a MOS capacitor having another oxide layer grown in accordance with the invention.
Figure 18B:
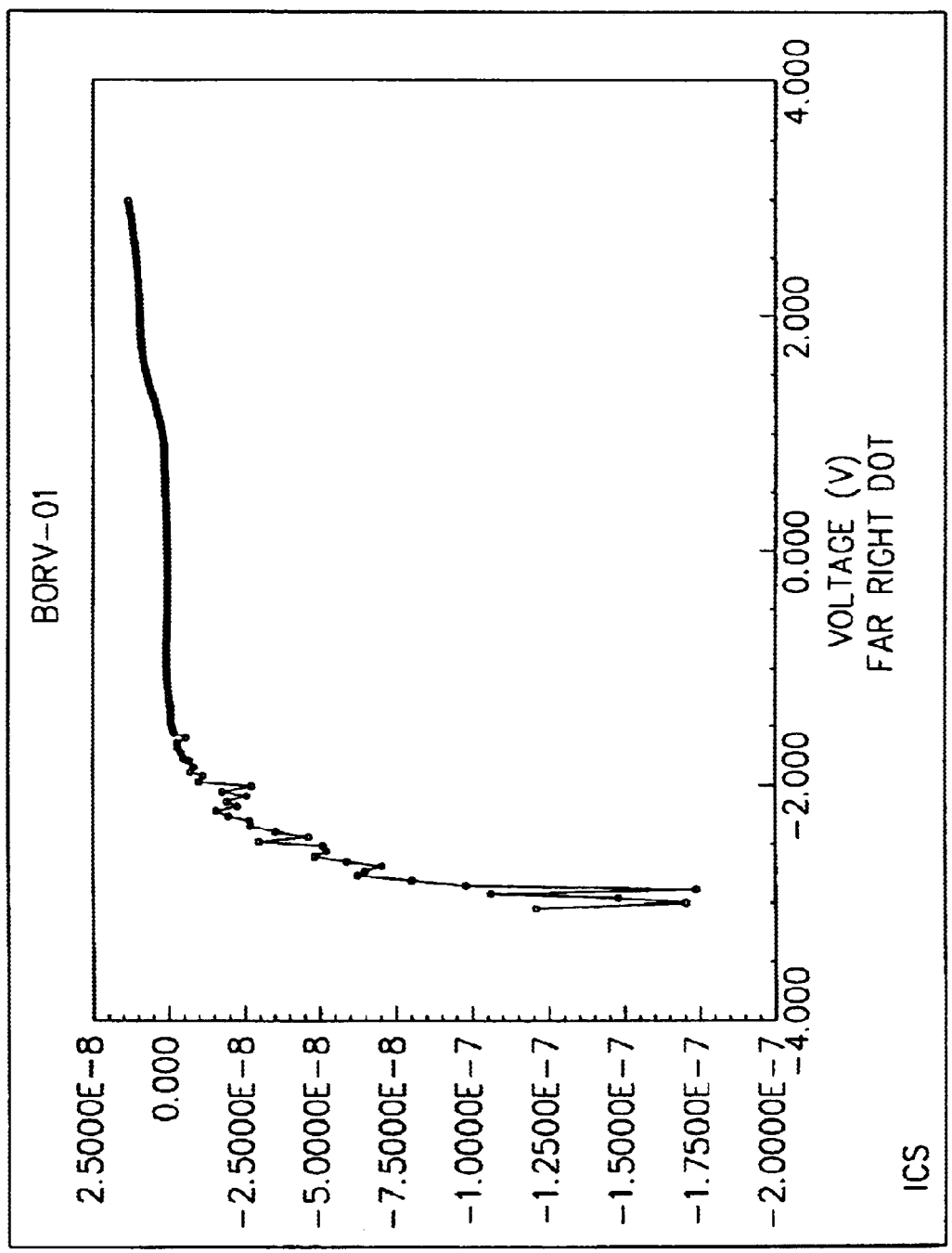

One example of I-V characteristics of one of the first 2×4 Al/as-grown RTWCG SiOX/Si/Ti—Au (oxide thickness about 120 nm) MOS test capacitors fabricated on a 90 nm thick low-Fe SiOX grown using a solution growth such as in FIG. 12 are shown in FIG. 18a and FIG. 18b.

Figure 19:
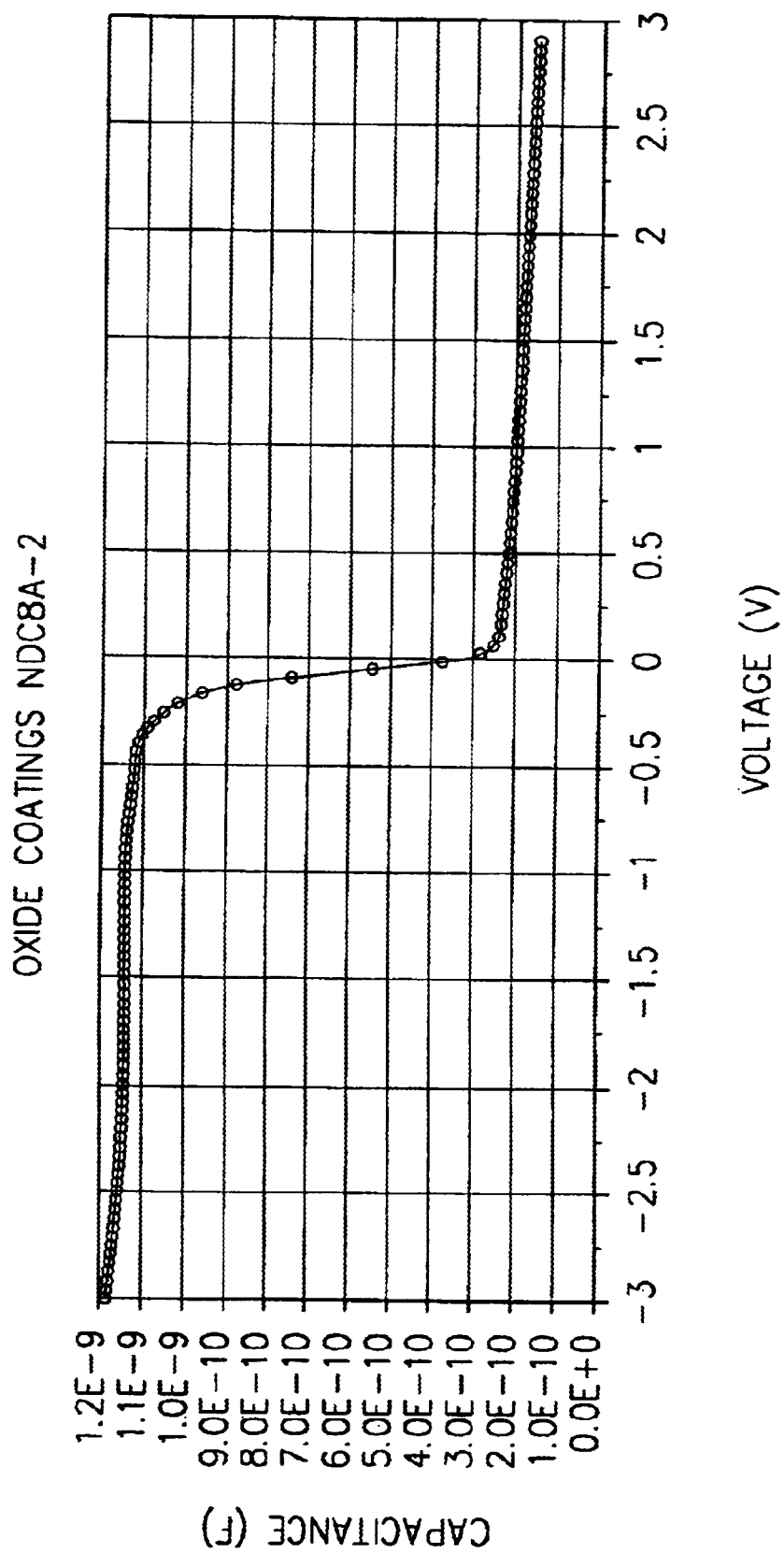
FIG. 19 is a graph showing the C-V characteristics for a MOS capacitor having a silicon oxide layer in accordance with the invention.

The C-V characteristics of most of these MOS devices are well behaved, and generally agree with the I-V characteristics and XPS data. One examples of a C-V characteristic for the MOS devices above are given in FIG. 19. The MOS capacitors fabricated on oxides with a lower density of metallic and non-metallic impurities have better behaved C-V characteristics, and a lower leakage current especially on negative bias, as clearly indicated by the reverse bias I-V characteristics.

EXAMPLE 5

Ultra-thin SiO-based Gate Dielectrics for Next Generation CMOS Technology

As CMOS technology is further scaled into the deep-submicron regime for higher integration density and performance, thinner gate oxide is required in order to provide sufficient current drive while the supply voltage is scaled down. The gate dielectric thickness must be reduced in order to maintain acceptable short-channel effects as the channel length of the MOSFET is reduced and to maximize drain current, $I_d$. One limit to the scaling of thin $SiO_2$ is the large leakage current due to direct tunneling.

The 1999 SIA Roadmap predicts that MOSFET gate length will be scaled down to 100 nm with gate $SiO_2$ thickness of 1.5–2 nm by the year 2006. This means that the industry will need to demonstrate the feasibility of 1.5 nm equivalent gate dielectrics soon after the year 2000. Further scaling of conventional $SiO_2$ or silicon oxynitride below 1.5 nm is hampered by many problems. The leakage current will increase to unacceptable levels and the boron penetration problem will be aggravated. In addition, it will be more difficult to control the uniformity and reproducibility of ultra-thin oxide growth processes.

The large leakage current problem of ultra-thin $SiO_2$ can be alleviated even for MOSFETs in memory arrays by using a thicker high permitivity gate dielectric material, e.g. $Ta_2O_5$. However, if an alternative gate dielectric is to be used, other issues concerning the gate material and processing compatibility may arise. Poly-$Si_{1-x}Ge_x$ has been reported as an alternative gate material to poly-Si requiring lower temperature for dopant activation. One of the problems yet to be solved before the poly-$Si_{1-x}Ge_x$ thin films can win the acceptance of semiconductor industry is to suppress the Ge diffusion into the top layer.

Recently, ultra-thin gate oxide (<2 nm) has been reported in CMOS devices. With such A thin oxides, the gate-depletion effect (GDE) and boron penetration have become critical and will place severe and contradicting constraints on the gate doping and annealing conditions. These technical problems impose strict limitations on the process window and the resultant device performance.

Various techniques have been proposed to reduce GDE or boron penetration. For example, a metal gate structure has been proposed to eliminate the gate-depletion effect. However, novel gate dielectric and low thermal budget are necessary in order to preserve $Si/SiO_2$ interface quality. In addition, the mid-gap work function of commonly used metals makes it unfavorable for deep-submicron CMOS applications. Oxide or nitride grown in NO, $N_2O$, or $NH_3$ ambient has been used to suppress boron penetration. However, channel mobility tends to be reduced when the nitrogen concentration in the gate dielectric is high, therefore boron penetration and GDE cannot be fully eliminated by this means. The nitridation in $NH_3$ was reported to introduce a large number of interface traps and fixed oxide charges. Direct nitrogen implantation into the gate material, the use of amorphous silicon (a-Si) as the gate materials, or reducing the annealing temperature have been shown to retard boron diffusion and therefore suppress boron penetration. However, all these techniques degrade GDE. Recent studies, as well as the large number of recent papers on this subject, show that the development of novel gate materials is a priority for future scaling of silicon MOS devices, and a winning material and technology for the ultra thin gate dielectrics is yet to be demonstrated.

Figure 15:
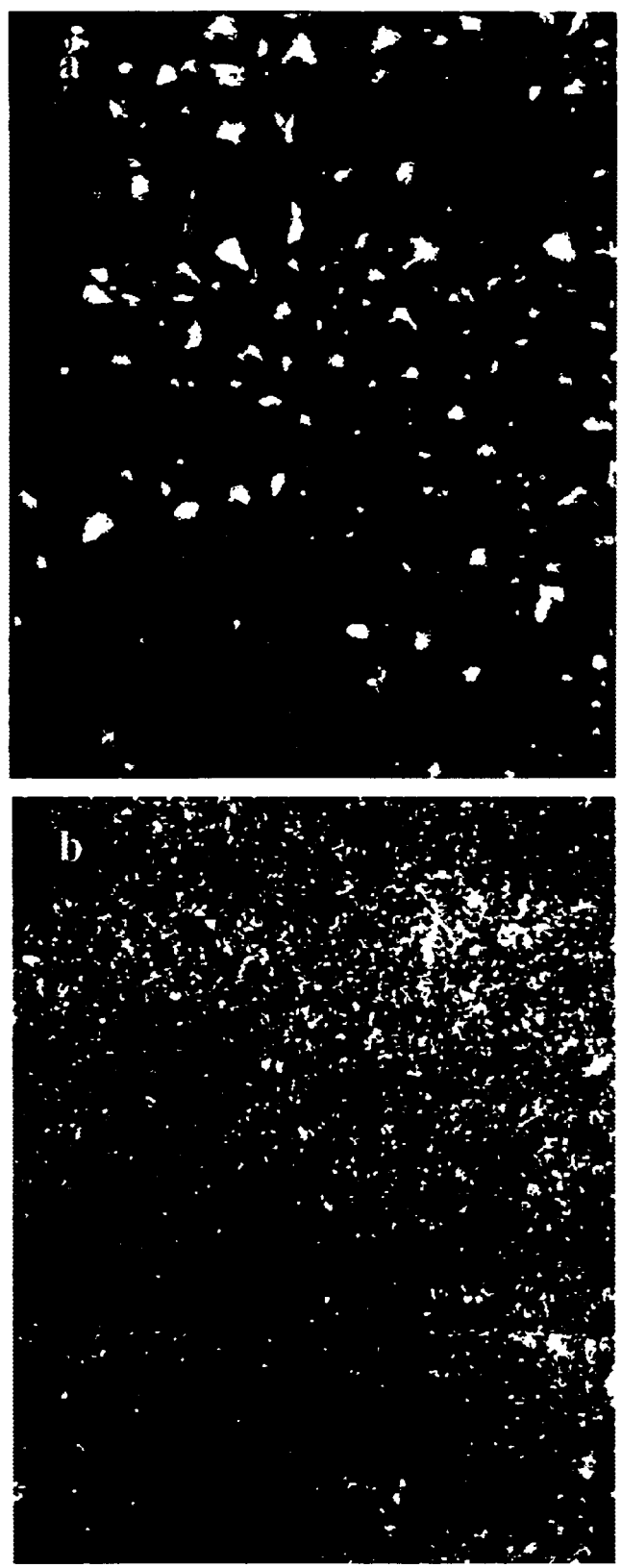
FIG. 15. RTWCG SiOX films on silicon surfaces with: a) pyramids and b) porous silicon coated topography (×1,100).

In FIG. 15a is shown a micron size pyramids coated (100) Si surface after the growth of a SiOX layer, and in FIG. 15b a SiOX film grown on a porous silicon (PS) coated Si wafer. No variation in the color of SiOX coatings can be seen on either surfaces. This is an essential finding, which should offer a proof-of-concept demonstration of the fact that the RTWCG SiOX films are extremely uniform, regardless of surface topography, crystalline orientation and features size. This is so since both surface topographies reveal various crystallographic planes, providing evidence of conformal SiOX coating using the room temperature WCG process. Furthermore, since the PS has nanometer-size features, this should provide enough evidence of the capabilities of this new process for ultra thin gate dielectrics for ULSI MOS devices with features size lower than 100 nm, for which none of the presently known dielectric deposition (growth) techniques seem to work.

Figure 4:
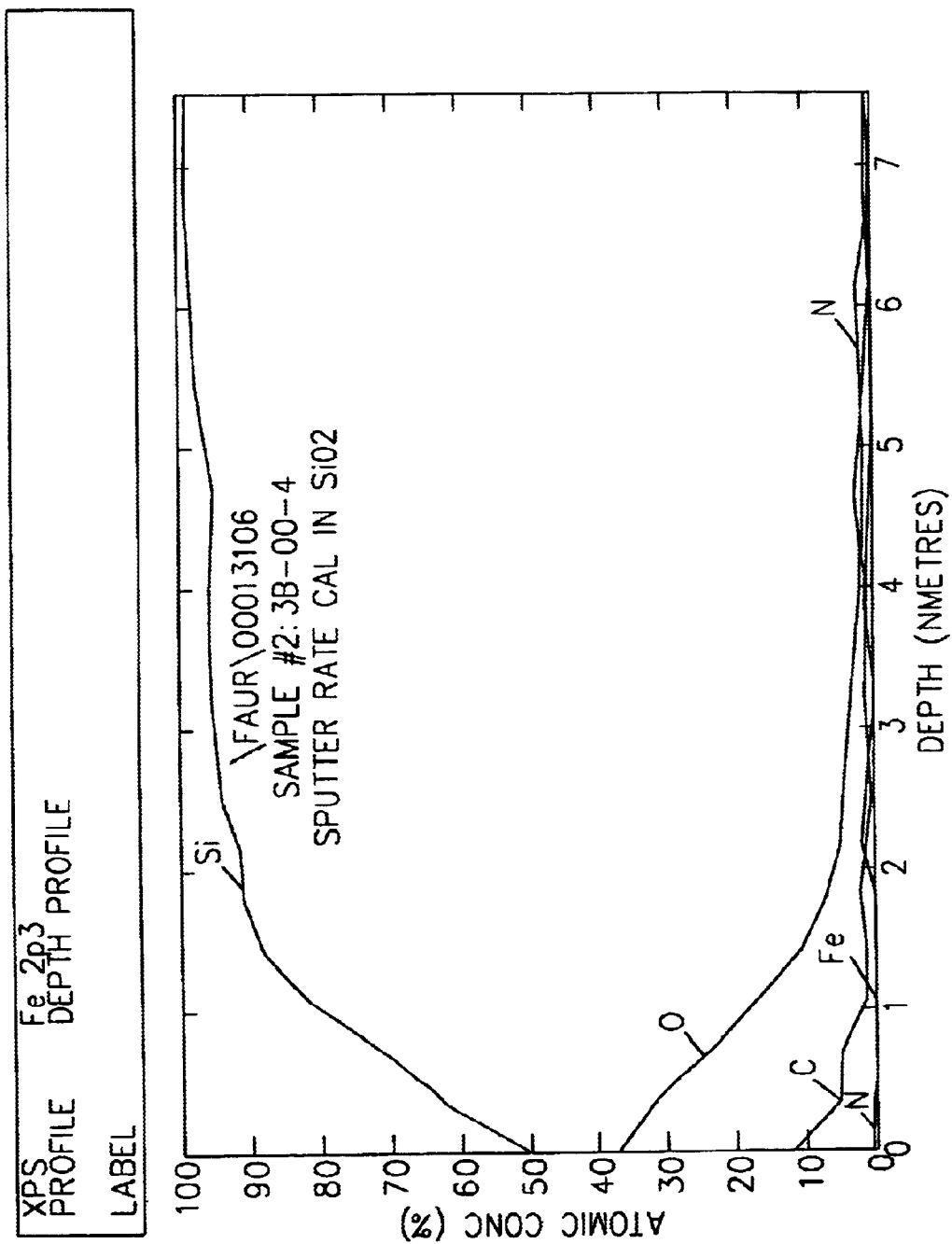
FIG. 4 is a XPS depth profile of a SiOX thin film grown for 4 minutes on a p-type Si substrate using a chemical growth solution made of: 5 volume parts of 34% HSiF, 2 volume parts of 60% HTiF solution, 1 volume part of 5% KFeCN aqueous solution, 3 volume parts of 5% nBPCl aqueous solution, and 3 volume parts of 0.5 M KOH and 1 volume part, respectively of 0.1 M of NaF aqueous solutions.
Figure 5:
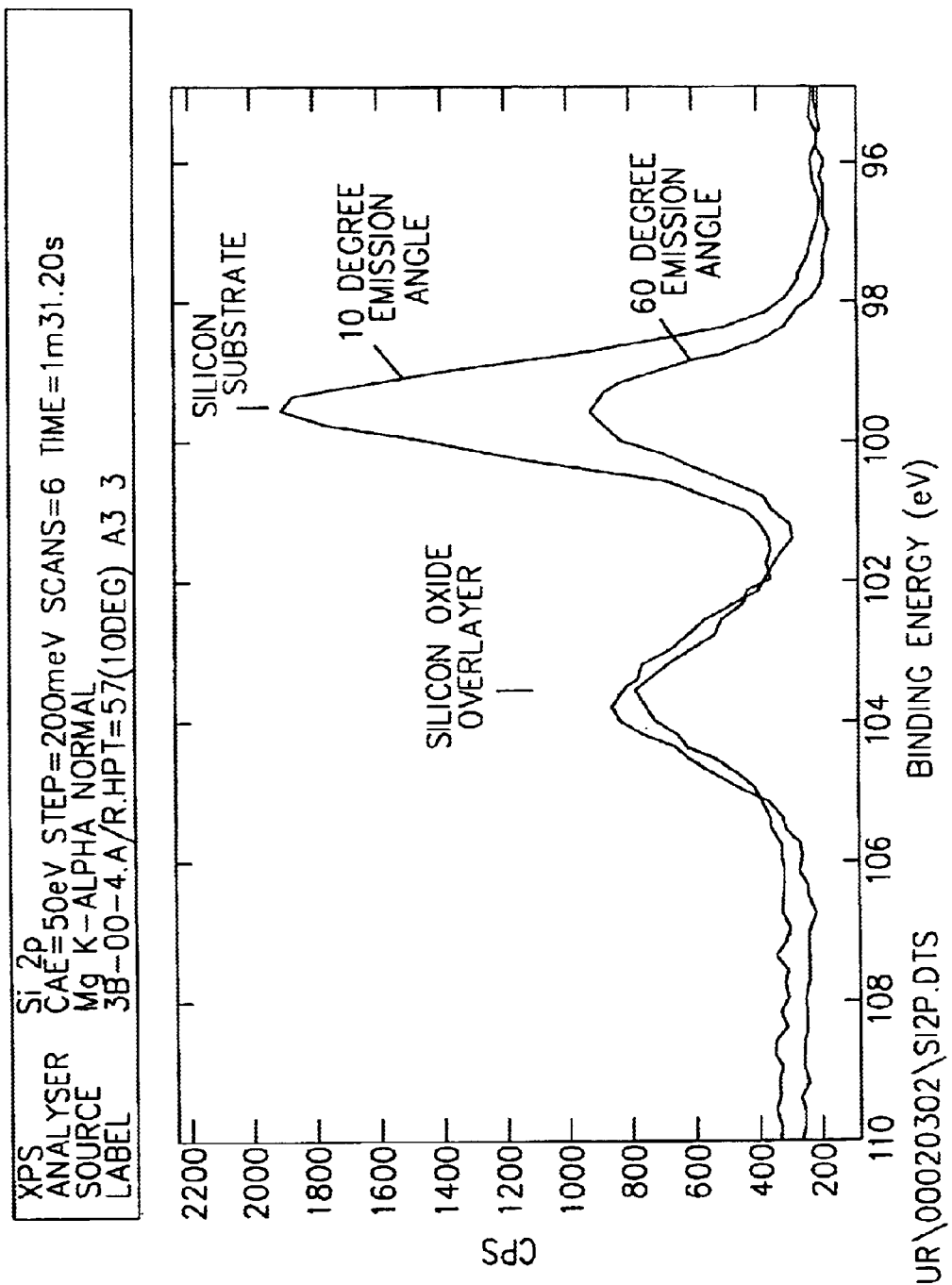
FIG. 5 Si 2p XPS spectra at generated at the surface of the thin SiOX film in FIG. 4 at 10° and 60° degrees emission angles.

Based on our preliminary investigation the RTWCG SiOX oxide grown in FIG. 4 and FIG. 4), could be a good candidate for use as a gate dielectric for low-power, high-speed integrated nanoelectronics. The growth rate of this oxide on (100) p-Si substrates is only about 2 nm/minute, which should allow a good thickness control of the growth of 2 to 4 nm thick oxides. The large surface C concentration and relatively large N interface concentration might explain the excellent chemical, UV and thermal stability, and, respectively, the excellent surface passivation capability of this oxide.

EXAMPLE 6

SiO-based Dielectric for Use as Passivating Films for Porous Silicon Coated Photonic (Optoelectronic) Devices Chemical stabilization of the PS material and conservation (or enhancement) of the luminescence efficiency are two current challenges confronting the development of porous-silicon-based photonic (optoelectronic) device applications.

As is known, good chemical stability is obtained upon oxidizing the PS surface, either thermally or by anodic oxidation. But this does not appear as a promising route for device application, because this impedes electrical carrier injection. On a single-crystal planar silicon surface, the hydride passivated surface is known to exhibit a fair stability against oxidation and contamination, at least on a time scale of a few hours. In contrast, the PS surface is much more prone to oxidation and contamination, and, especially for high porosity samples, the infrared spectra exhibit traces of contaminated native oxide formation, after a few tens of minutes in air. On the other hand, on flat silicon crystals, methloxylation of the surface has been reported as a key factor in order to account for the long-term stability and the low interfacial recombination characteristics in methanol-based photoelectrochemical cells. Similar modifications of the porous silicon surface then appears highly attractive since it might provide a much more stable surface which could be used as a processing step for device applications. In a recent study after formation of PS in concentrated BF electrolyte, methoxy groups were formed trough partial anodic dissolution of the hydrogenated PS surface in anhydrous methanol. The methoxylated surface exhibited improved optical characteristics (increased photoluminescence efficiency and blue shift of the emission), similar to PS anodically oxidized in a nonfluoride aqueous electrolyte. Its stability against aging was also improved as compared to that of the hydrogenated surface, but without reaching the stability of anodically oxidized PS. The relative instability is ascribed to the amount of SiH species, which remain, on the methoxylated surface upon the modification process.

Basic properties of PS, such as photoluminescence (PL) origin, formation mechanism, and structure, have been extensively studied. Meanwhile, the fundamentals of PS devices are being developed. It is important to develop a corresponding device technology for PS that is compatible with the conventional integrated circuit technology. For example, a key step in the fabrication of PS devices and integrated optoelectronic circuits is the formation of light emitting patterns. This is a difficult process because any postprocessing will seriously affect the properties of PS due to its porous, fragile, and chemically reactive structure.

Recently we started a very preliminary study on the possibility of increasing the stability of PS material against aging using RTWCG grown SiOCN-rich thin film coatings for photonic (optoelectronic) device applications, and in particular for low reflection passivated front surface formation for Si solar cell applications. The PS was formed chemically on (111) and (100) Si substrates, using a solution based on HF and $HNO_3$. Then, a RTWCG of thin SiOX layers were grown at room temperature (see FIG. 13b).

The RTWCG process of SiOCN layers on the PS surface, a room temperature process, appears highly attractive for photonic (optoelectronic) device applications, since it will provide a much more stable surface in reducing and oxidizing agents and with respect to factors such as heat, humidity, prolonged exposure to UV light, atomic oxygen and ionizing radiation during postprocessing steps and as a result of exposing the fabricated devices to such environments. Based on our preliminary work, it appears that compared to planar silicon surfaces, good quality WCG SiOCN coatings are much easier to grow on PS coated Si surfaces. The reason for this is not fully understood at the present time.

EXAMPLE 7

SiO-based RTWCG SiOX Thin Films for Use as Sacrificial Layer in the Fabrication of MEMS Devices One of the main goals of microengineering is to be able to integrate microelectronic circuitry into micromachined structures, to produce completely integrated systems For silicon micromachining, usually MEMS manufacturers are using $SiO_2$ as a sacrificial/passivation layer. The current state of the art involves $SiO_2$ formation using high temperature thermal oxidation and CVD techniques.

For MEMS applications, the use of the RTWCG SiOX technology to grow a sacrificial/passivating layer is a very attractive alternative to other technologies, since:

the WCG process has reduced capital and materials costs, eliminates several concomitant photoresist, etching and surface passivation steps, thus reducing fabrication costs;

the SiOX coatings, grown at room temperature, are easy to apply, passivate well the Si surfaces, are physically hard, and non-straining on the substrate;

the WCG SiOX films are quite stable with respect to factors such as heat, humidity, prolonged exposure to UV light, and should have good stability to atomic oxygen and resistant to high fluences of energetic electrons and protons

EXAMPLE 8

SiO-based RTWCG SiOX Thin Films for Use as High-k Dielectrics

In DRAM memory cells, for example, a high dielectric constant (k) is desirable because the higher the dielectric constant, the more charge they can store. The question, for gate applications, of whether any other dielectric may replace $SiO_2$, has not yet been answered. Oxides, nitrides, or so-called oxynitrides are now used for these applications, but the trend is to use materials with higher dielectric constants like tantalum oxide ($Ta_2O_5$) and barium strontium titanate (BST), and for the more distant future, ferroelectrics.

High dielectric materials are needed for advanced DRAM capacitors because there is no other choice: these can reduce dielectric thickness, increase the capacitor area, or increase the dielectric constant. The present state-of-the-art in capacitor material is ONO (oxide/nitride/oxide), which has an effective dielectric constant of about 5. By comparison, the dielectric constants for $Ta_2O_5$ and BST are 25 and over 500, respectively. ONO films are formed using high temperature processes similar to those discussed for gate oxides.

While $Ta_2O_5$ is by far the best characterized of high dielectric constant metal oxides, other single metal oxides such as $Nb_2O_3$, $Al_2O_3$, $Y_2O_3$, $Hf_2O_3$, $ZrO_2$ and $TiO_2$ are not ruled out. The main attraction of these materials is their relatively high dielectric constant, which ranges from 10–100, depending on the material, microstructure, crystalline phase and respective orientation.

The general belief is that the above metal oxides will be used only as an intermediate step between the dielectrics used today and feroelectric materials that may be used in the future. The common problems associated with the use of these dielectrics is whether or not they can be used for lower than 0.25 $\mu$m critical features. For example metal oxides with high dielectric constant such as $Y_2O_3$ and $Ta_2O_5$ have large electron traps and therefore might be limited to capacitor applications. Also, at present, there is not enough data to judge the future of feroelectic films.

Based on our preliminary investigation the RTWCG SiOX oxide that incorporates a large percentage of heavy metals such as Sr, Ti, and Ba could be a good candidate for use as a high dielectric constant (high k) material for DRAM applications , and as gate dielectric for the next generation IC's.

EXAMPLE 9

SiO-based RTWCG SiOX Thin Films for Use as First Oxide Layer

Figure 16:
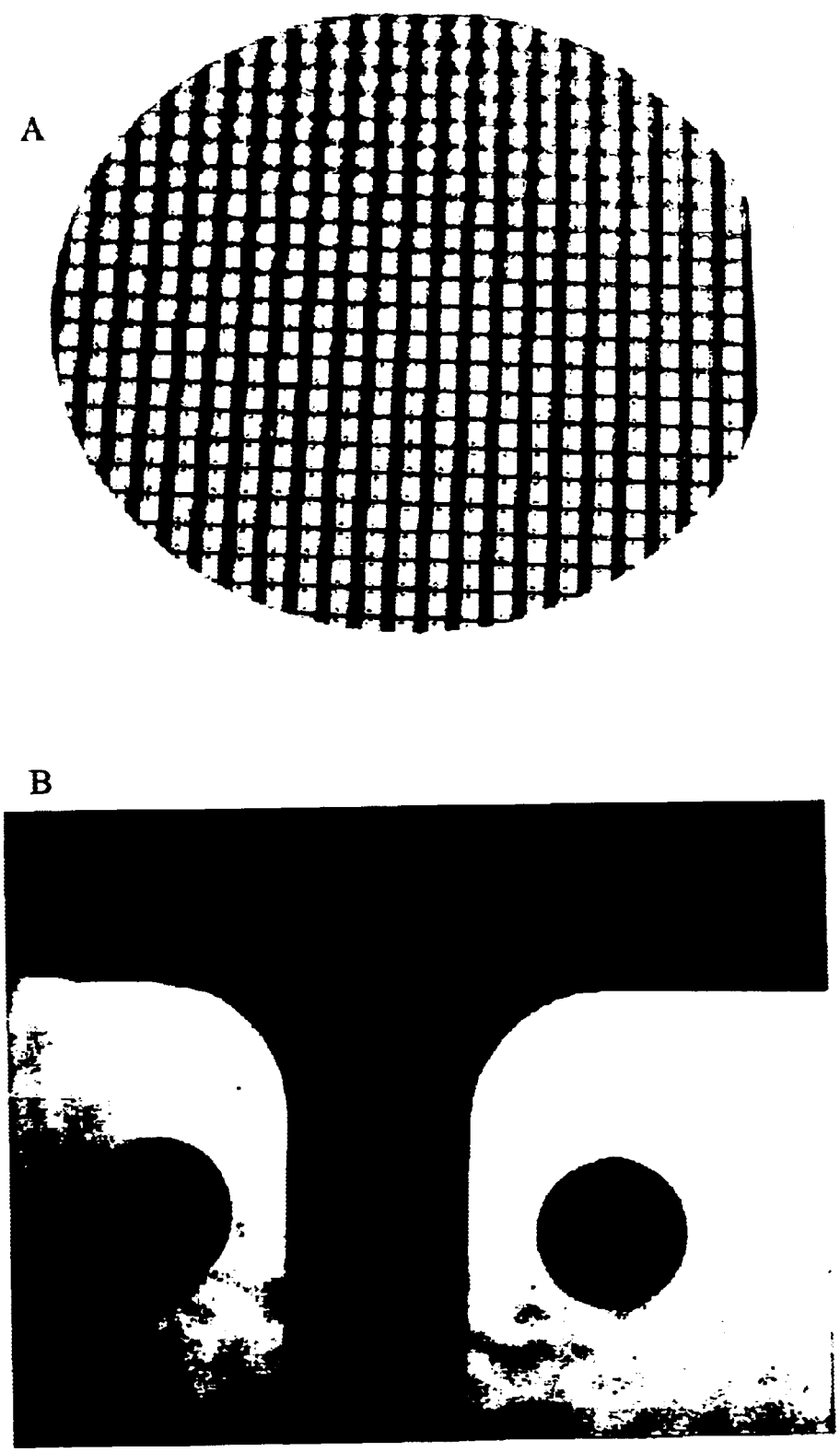
FIG. 16a shows selective growth on a semiconductor substrate in areas uncovered by a photoresist layer in accordance with the invention.
FIG. 16b is similar to FIG. 16a, but on an enlarged scale.

The first step in the fabrication of any semiconductor device is the growth/deposition of the so called first oxide layer (FOL) that is initially used as a diffusion barrier. The FOL is usually grown/deposited onto the semiconductor substrate using a high temperature process such as thermal oxidation or CVD processes. The use of the RTWCG oxide with low metallic and non-metallic impurity concentrations such as in FIG. 11 and FIG. 12 can be extremely beneficial. For example, since the RTWCG is compatible with photoresists schemes, the selective growth of the SiOX FOL in areas uncovered by the photoresist (see FIG. 16) will reduce the number of process steps needed at the front end of any semiconductor fabrication technology.

EXAMPLE 10

SiO-based RTWCG SiOX Thin Films for Use as Poly-Si TFT Gate Dielectrics for the Low-cost, Low-temperature TFT-LCD Applications Many manufacturers of thin film transistors (TFT) for TFT-liquid crystal display (LCD) applications (TFT-LCD) are directing considerable R&D effort toward the development of low-temperature poly-Si (LTPS) technology because it promises to produce higher-performance displays at lower cost. Among the critical processes that will require further development is the need to develop a cost-effective LTPS technology for the poly-Si TFT gate dielectrics. For these applications the RTWCG SiOX process can become a process of choice for the poly-Si and a-Si TFT gate dielectrics, because it is a room temperature process and potentially has high output, low down time, and reduced capital and materials costs.

While the invention has been particularly shown and described with reference to preferred embodiments thereof, it will be understood by those skilled in the art that other changes in form and details may be made therein without departing from the spirit and scope of the invention. For instance larger. From among large number of possible electronic and photonic (optoelectronic) device applications we have only mentioned the ten above examples. It will be understood by those skilled in the art that any that these RTWCG SiOX oxides can be used for a wide range of electronic and photonic (optoelectronic) device applications, especially where the specific application requires, or will benefit from a low temperature SiOX oxide process step, without departing from the spirit and scope of the invention. Other applications described herein, which make use of various description of these oxides are also covered by this invention. A partial list of examples of applications or class of applications that will benefit most by replacing the currently used with the RTWCG SiOX technology include:

Protective Coatings
Field Oxide
Sidewall Spacers
Discrete Device Insulation
Integrated Optics
Nanostructures
Optical Films Substrates may be any material on which it is desirable to have a silicon oxide coating including:

1. silicon wafers of all crystalline configurations and architectures such as porous, grooved, patterned, trenched, and scribed;
2. plastic, glass, or metal objects or films;
3. or any semiconductor layer, substrate or device using Group IV elements, and III-V, I-III-VI, or II-VI compound semiconductors such as substrates and active layers used in integrated circuitry, photonics and optoelectronic devices.

While in accordance with the Patent Statutes the best mode and preferred embodiment have been set forth, the scope of the invention is not limited thereto but rather by the scope of the attached claims.

What is claimed is:

1. A method for room temperature wet chemical growth of a silicon oxide-based layer on a substrate comprising the steps of providing a reaction mixture including:

a silicon source;

a catalyst; and an aqueous reduction-oxidation solution containing metallic ions $Me^{+n}$ or $Me^{+(n+m)}$ wherein:

Me is a transitional metallic ion selected from the group consisting of Ti, Co, V, Cr, Ni, Sr, Cu, Ce, Y, Zr, Nb, Ru, RH, and Pd; and n=0 to 4 and m=1 to 4; and reacting said reaction mixture with said substrate at a temperature below 40 degrees C. to form said silicon oxide layer.

2. A method according to claim 1, wherein said silicon source is an organic or an inorganic compound.

3. A method according to claim 2, wherein said silicon source is an organic compound selected from the group consisting of $(CH_3)_3SiOK$, $(CH_3)_4NOH:10SiO_2$, $(CH_3)_3CSi(CH_3)_2Cl$, $[(CH_3)SiO]_4$, $CaSiO_3$, $CaSiO_2$, and $[(CH_3)Si]NK$.

4. A method according to claim 2, wherein said silicon source is an inorganic compound selected from the group consisting of $SiF_4$, $SiBr_4$, $SiCl_2O$, $K_2SiF_6$, $Mg_2Si3O_8$, $MoSi_2$, $Na_2SiO_3$, $SiS_2$, $ZrSi_2$, $Mg_2Si$, $H_2SiF_6$, $(NH_4)_2SiF_6$, $SiO_2$, SiO, Si.

5. A method according to claim 1 or 4, wherein said aqueous reduction-oxidation solution includes at least one of $Fe^{2+}$ ions or $Fe^{3+}$ ions.

6. A method according to claim 1 or 4 wherein said aqueous reduction-oxidation solution includes at least one member selected from the group consisting of $Fe^{2+}/Fe^{3+}$, $K_3Fe(CN)_6$, and Fe EDTA.

7. A method according to claim 1 or 4, wherein said catalyst includes at least one member selected from the group consisting of $Pd(O_2C_2F_3)_2$, $H_2TiF_6$, $TiCl_4$ and $(NH_4)_2TiF_6$.

8. A method according to claim 1 or 4, wherein said aqueous reduction-oxidation solution also includes at least one non-invasive additive selected from the group consisting of NaF, KOH, NaF and $NH_4F$, HCl, $H_2SO_4$, and $H_2O_2$.

9. A method according to claim 1 or 4, wherein said step of reacting said reaction mixture to form said silicon oxide layer includes a thickness growth rate of said layer and said silicon oxide layer includes at least one contaminant selected from the group consisting of iron, palladium and titanium, and said growth rate may be increased and said contaminants decreased by dilution of said reaction mixture to increase hydration of silicon groups.

10. A method according to claim 1 or 4, wherein said step of reacting said reaction mixture to form said silicon oxide layer includes a thickness growth rate of said layer and said silicon oxide-based layer includes at least one contaminant selected from the group consisting of iron, palladium and titanium, and said growth rate may be increased and said contaminants decreased by including a pyridine compound.

11. A method according to claim 10, wherein said pyridine compound is one or more of pyridine and C1 to C6 alkyl pyridine and salts and complexes thereof.

12. A method according to claim 11, wherein said pyridine salt is an n,n-butyl pyridinium compound.

13. A method according to claim 12, wherein said pyridinium compound is n,n-butylpyridinum chloride.

14. A method for room temperature wet chemical growth of a silicon oxide layer on a substrate comprising the steps of providing a reaction mixture including:
   a silicon source;
   a catalyst; and
   an aqueous solution of a transitional metallic ion, Me, selected from the group consisting of Ti, Co, V, Cr, Ni, Sr, Cu, Ce, Y, Zr, Nb, Ru, RH, and Pd; and
   reacting said reaction mixture with said substrate at a temperature below 40 degrees C. to form said silicon oxide layer.

15. A method according to claim 14, wherein said silicon source is an organic or an inorganic compound.

16. A method according to claim 15, wherein said silicon source is an organic compound selected from the group consisting of $(CH_3)_3SiOK$, $(CH_3)_4NOH:10SiO_2$, $(CH_3)_3CSi(CH_3)_2Cl$, $[(CH_3)SiO]_4$, $CaSiO_3$, $CaSiO_2$, and $[(CH_3)Si]NK$.

17. A method according to claim 15, wherein said silicon source is an inorganic compound selected from the group consisting of $SiF_4$, $SiBr_4$, $SiCl_2O$, $K_2SiF_6$, $Mg_2Si3O_8$, $MoSi_2$, $Na_2SiO_3$, $SiS_2$, $ZrSi_2$, $Mg_2Si$, $H_2SiF_6$, $(NH_4)_2SiF_6$, $SiO_2$, $SiO$, $Si$.

18. A method according to claim 16 or 17, wherein said aqueous solution includes at least one of $Fe^{2+}$ ions or $Fe^{3+}$ ions.

19. A method according to claim 14 or 17 wherein said aqueous solution includes at least one member selected from the group consisting of $Fe^{2+}/Fe^{3+}$, $K_3Fe(CN)_6$, and Fe EDTA.

20. A method according to claim 14 or 17, wherein said catalyst includes at least one member selected from the group consisting of $Pd(O_2C_2F_3)_2$, $H_2TiF_6$, $TiCl_4$ and $(NH_4)_2TiF_6$.

21. A method according to claim 14 or 17, wherein said aqueous solution also includes at least one non-invasive additive selected from the group consisting of NaF, KOH, NaF and $NH_4F$, HCl, $H_2SO_4$, and $H_2O_2$.

22. A method according to claim 14 or 17, wherein said metallic ion Me has an electron state of $Me^{+n}$ or $Me^{+(n+m)}$ where n=0 to 4 and m=1 to 4.

23. A method according to claim 14 or 17, wherein said step of reacting said reaction mixture to form said silicon oxide layer includes a thickness growth rate of said layer and said silicon oxide layer includes at least one contaminant selected from the group consisting of iron, palladium and titanium, and said growth rate may be increased and said contaminants decreased by dilution of said reaction mixture to increase hydration of silicon groups.

24. A method according to claim 14 or 17, wherein said step of reacting said reaction mixture to form said silicon oxide layer includes a thickness growth rate of said layer and said silicon oxide-based layer includes at least one contaminant selected from the group consisting of iron, palladium and titanium, and said growth rate may be increased and said contaminants decreased by including a pyridine compound.

25. A method according to claim 24, wherein said pyridine compound is one or more of pyridine and C1 to C6 alkyl pyridine and salts and complexes thereof.

26. A method according to claim 25, wherein said pyridine salt is an n,n-butyl pyridinium compound.

27. A method according to claim 26, wherein said pyridinium compound is n,n-butylpyridinum chloride.

28. A method for room temperature wet chemical growth of a silicon oxide-based layer on a substrate comprising the steps of providing a reaction mixture including:
   a silicon source selected from the group consisting of $(CH_3)_3SiOK$, $(CH_3)_4NOH:10SiO_2$, $(CH_3)_3CSi(CH_3)_2Cl$, $[(CH_3)SiO]_4$, $CaSiO_3$, $CaSiO_2$, and $[(CH_3)Si]NK$.;
   a catalyst; and
   an aqueous reduction-oxidation solution; and
   reacting said reaction mixture with said substrate at a temperature below 40 degrees C. to form said silicon oxide layer.

29. A method for room temperature wet chemical growth of a silicon oxide-based layer on a substrate comprising the steps of providing a reaction mixture including:
   a silicon source;
   a catalyst; and
   an aqueous reduction-oxidation solution; and
   reacting said reaction mixture with said substrate at a temperature below 40 degrees C. to form said silicon oxide layer with a thickness growth rate of said layer and at least one contaminant selected from the group consisting of iron, palladium and titanium, and diluting said reaction mixture to increase hydration of silicon groups and thereby increase said growth rate and decrease the concentration of said at least one contaminant.

* * * * *

UNITED STATES PATENT AND TRADEMARK OFFICE
CERTIFICATE OF CORRECTION

PATENT NO. : 6,613,697 B1  Page 1 of 1
DATED : September 2, 2003
INVENTOR(S) : Maria Faur et al.

It is certified that error appears in the above-identified patent and that said Letters Patent is hereby corrected as shown below:

Column 5,
Line 16, after "4%", please insert -- HCl --.

Column 6,
Line 34, please delete "Si—F—Si—OH", and insert therefor -- Si—F→ Si—OH --.

Column 13,
Line 30, please delete "n-BCPI", and insert therefor -- n-BPCi --.

Column 24,
Line 9, after "such", please delete "A".

Column 25,
Line 22, please delete "BF", and insert therfor -- HF --.

Column 29,
Line 33, please delete "claim 16 or 17", and insert therefor -- claim 14 or 17 --.

Signed and Sealed this

Tenth Day of February, 2004

JON W. DUDAS
*Acting Director of the United States Patent and Trademark Office*